US009521198B1

(12) United States Patent
Agarwala et al.

(10) Patent No.: US 9,521,198 B1
(45) Date of Patent: Dec. 13, 2016

(54) SYSTEMS AND METHODS FOR IMPLEMENTING AN ENTERPRISE-CLASS CONVERGED COMPUTE-NETWORK-STORAGE APPLIANCE

(71) Applicant: Springpath, Inc., Sunnyvale, CA (US)

(72) Inventors: Sandip Agarwala, Cupertino, CA (US);
Abhishek Chaturvedi, Mountain View, CA (US); Shravan Gaonkar, Gainesville, FL (US); Mallikarjunan Mahalingam, Cupertino, CA (US); Sazzala Reddy, Los Altos, CA (US); Smit Shah, Sunnyvale, CA (US); Faraz Shaikh, Sunnyvale, CA (US); Praveen Vegulla, Cupertino, CA (US); Krishna Yadappanavar, Sunnyvale, CA (US); Jeffrey A. Zabarsky, Sunnyvale, CA (US)

(73) Assignee: Springpath, Inc., Sunnyvale, CA (US)

( * ) Notice: Subject to any disclaimer, the term of this patent is extended or adjusted under 35 U.S.C. 154(b) by 138 days.

(21) Appl. No.: 14/135,485

(22) Filed: Dec. 19, 2013

Related U.S. Application Data

(60) Provisional application No. 61/739,685, filed on Dec. 19, 2012.

(51) Int. Cl.
*H04L 29/08* (2006.01)
(52) U.S. Cl.
CPC .................................. *H04L 67/1097* (2013.01)
(58) Field of Classification Search
CPC ................. H04L 67/1097; H04L 67/2842
USPC ........ 709/212, 213, 214, 219; 711/114, 162, 711/165
See application file for complete search history.

(56) References Cited

U.S. PATENT DOCUMENTS

| 5,692,185 A | 11/1997 | Nilsen |
| 7,246,211 B1 | 7/2007 | Beloussov |

(Continued)

OTHER PUBLICATIONS

"VMWare Virtual SAN Hardware Guidance"—VMWare, Jun. 2009 https://www.vmware.com/files/pdf/products/vsan/VMware-TMD-Virtual-SAN-Hardware-Guidance.pdf.*

(Continued)

*Primary Examiner* — Randy Scott
(74) *Attorney, Agent, or Firm* — Blakely, Sokoloff, Taylor & Zafman LLP

(57) ABSTRACT

A distributed storage system that dispatches an input/output request is described. In an exemplary embodiment, a storage controller client receives the input/output request, wherein the distributed storage system includes the storage controller client, a plurality of storage controller servers, a plurality of virtual nodes distributed among a plurality of physical nodes, and each of the plurality of physical nodes is hosted on one of the plurality of storage controller servers. The storage controller client further computes a target virtual node for the input/output request, where the target virtual node is one of the plurality of virtual nodes. Using the computed target virtual node, the storage controller client determines a target physical node that corresponds to the target virtual node, where the target physical node is one of the plurality of physical nodes. In addition, the storage controller client dispatches the input/output request to a target storage controller that corresponds to the target physical node, wherein the target storage controller server is one of the plurality of storage controller servers. In addition, the virtual node includes a set of one or more mirrored copies across different fault domains for ensuring resiliency and high availability.

22 Claims, 21 Drawing Sheets

(56) References Cited

U.S. PATENT DOCUMENTS

| | | | |
|---|---|---|---|
| 7,395,378 B1 | 7/2008 | Pendharkar | |
| 7,757,202 B2 | 7/2010 | Dahlstedt | |
| 8,935,302 B2 | 1/2015 | Flynn | |
| 9,110,792 B1 | 8/2015 | Douglis | |
| 2001/0052073 A1* | 12/2001 | Kern et al. | 713/161 |
| 2003/0014599 A1* | 1/2003 | McBrearty et al. | 711/148 |
| 2003/0189930 A1* | 10/2003 | Terrell et al. | 370/389 |
| 2005/0114402 A1 | 5/2005 | Guthrie | |
| 2005/0193272 A1 | 9/2005 | Stager | |
| 2005/0268054 A1* | 12/2005 | Werner et al. | 711/162 |
| 2010/0191783 A1 | 7/2010 | Mason | |
| 2010/0198795 A1 | 8/2010 | Chen | |
| 2011/0196900 A1 | 8/2011 | Drobychev | |
| 2011/0225214 A1 | 9/2011 | Guo | |
| 2011/0258480 A1* | 10/2011 | Young et al. | 714/2 |
| 2011/0282842 A1 | 11/2011 | Popovski | |
| 2012/0047111 A1 | 2/2012 | Hayden | |
| 2012/0210095 A1 | 8/2012 | Nellans | |
| 2012/0278512 A1* | 11/2012 | Alatorre et al. | 710/33 |
| 2014/0122795 A1* | 5/2014 | Chambliss | 711/114 |
| 2015/0039717 A1* | 2/2015 | Chiu et al. | 709/214 |

OTHER PUBLICATIONS

"The Case for Persistent Full Clones," Deepstorage.net, http://getgreenbytes.com/wp-content/uploads/2013/05/FULL_CLONE_PERSISTENT_VDI-FINAL.pdf, 18 pages.

Rodeh, Ohad, "B-trees, Shadowing, and Clones," *ACM Transactions on Storage (TOS)3*, No. 4, https://www.usenix.org/legacy/events/lsf07/tech/rodeh.pdf, (2008), 51 pages.

Rodeh, Ohad, "B-trees, Shadowing, and Clones," *ACM Transactions on Computational Logic,* vol. V, No. N, (Aug. 2007), 26 pages.

Shaoshan Liu et al., "Parker: Parallel Gargage Collerctor Based on Virtual Spaces", Computers, IEEE Transactions on Year: 2012, vol. 6, Issue: 11, pp. 1611-1623, DOI: 10.1109/TC.2011.193.

\* cited by examiner

SYSTEMS AND METHODS FOR IMPLEMENTING AN ENTERPRISE-CLASS CONVERGED COMPUTE-NETWORK-STORAGE APPLIANCE

RELATED APPLICATIONS

Applicant claims the benefit of priority of prior, provisional application Ser. No. 61/739,685, filed Dec. 19, 2012, the entirety of which is incorporated by reference.

FIELD OF INVENTION

This invention relates generally to a storage system and more particularly to software defined distributed storage system.

BACKGROUND OF THE INVENTION

Enterprise storage systems currently available are proprietary storage appliances that integrate the storage controller functions and the storage media into the same physical unit. This centralized model makes it harder to independently scale the storage systems' capacity, performance and cost. Users can get tied to one expensive appliance without the flexibility of adapting it to different application requirements that may change over time. For small and medium scale enterprise, this may require huge upfront capital cost. For larger enterprise datacenters, new storage appliances are added as the storage capacity and performance requirements increase. These operate in silos and impose significant management overheads.

SUMMARY OF THE DESCRIPTION

A software defined distributed storage system that separates the storage controller functions with that of storage media is described. In an exemplary embodiment, a storage controller client dispatches an input/output request to one of a plurality of storage controller servers in a software defined distributed storage system. The software defined distributed storage system further includes a plurality of virtual nodes distributed among a plurality of physical nodes, and each of the plurality of physical nodes is hosted on one of the plurality of storage controller servers. Each physical node may be a commodity server hardware with one or more physical storage media (Hard Disk Drive, Solid State Drive, Flash devices, etc.) for storing data and its metadata. Each virtual node is allocated some physical space in one or more physical storage media where its contents are stored with enough redundancy to recover from failures. The storage controller client receives the input/output request. The storage controller client further computes a target virtual node for the input/output request, where the target virtual node is one of the plurality of virtual nodes. Using the computed target virtual node, the storage controller client determines a target physical node that corresponds to the target virtual node, where the target physical node is one of the plurality of physical nodes. In addition, the storage controller client dispatches the input/output request to a target storage controller server that corresponds to the target physical node, wherein the target storage controller server is one of the plurality of storage controller servers.

In another embodiment, a storage controller server receives a write operation request to store data, where the write operation request is dispatched from a storage controller client to the storage controller server using a deterministic placement function. In response to the write operation request, the storage controller server appends the data to a write log in an active log partition of the storage controller server.

In a further embodiment, a storage controller server receives a read operation request, where the read operation request is dispatched from a storage controller client to the storage controller server using a deterministic placement function. In response to receiving the read operation request, the storage controller server reads the data that is indicated in the read operation request, where at least part of the data is stored in a write log that is in an active log partition of the storage controller server.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
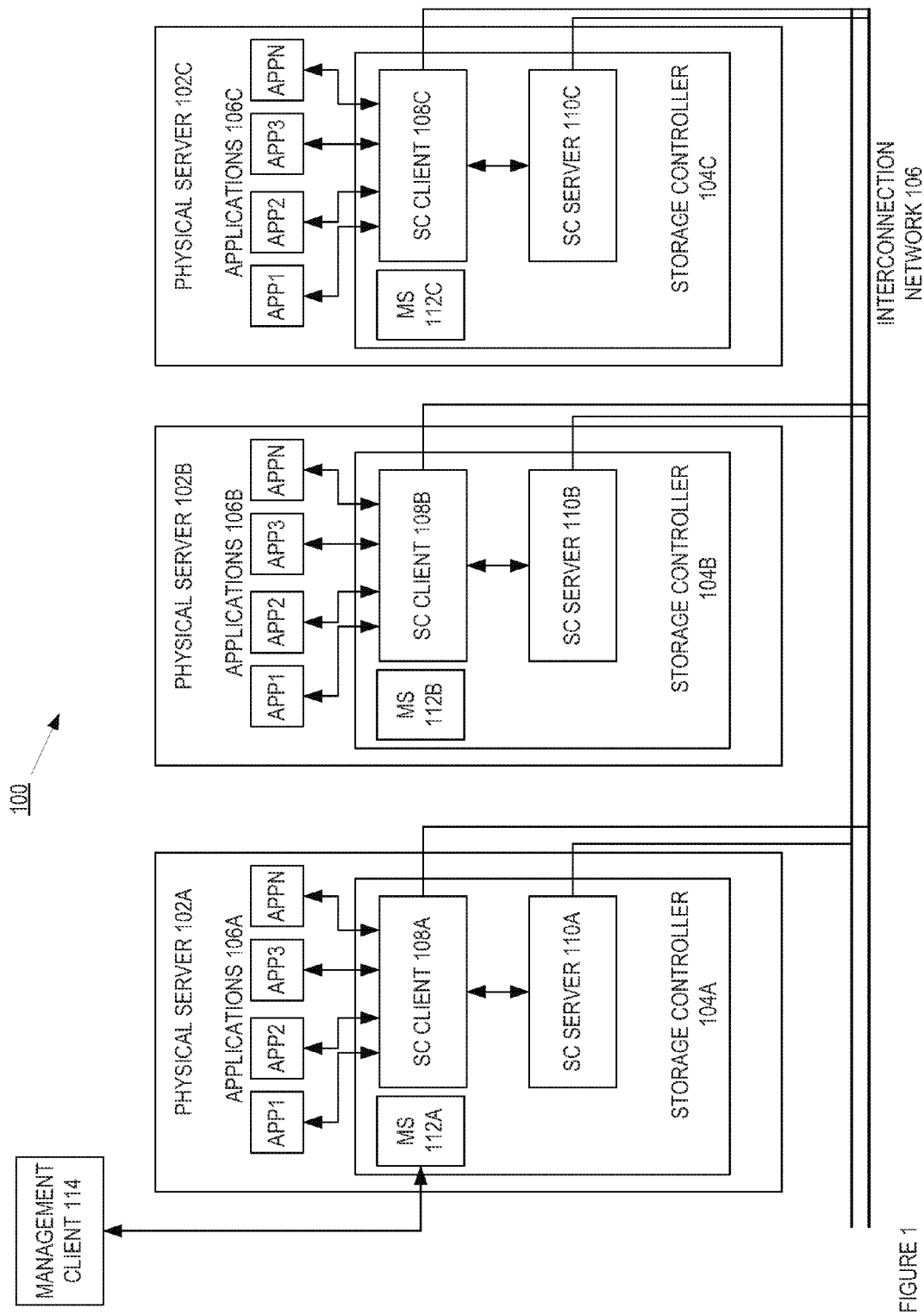
FIG. 1 is an illustration of one embodiment of a high-level view of StorFS system.

A software defined distributed storage system called StorFS that separates the storage controller functions with that of storage media is described. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A software defined distributed storage system called StorFS that separates the storage controller functions with that of storage media is described. In one embodiment, this separation allows the storage controller to be co-located with the user application in the same physical units or reside separately in a dedicated set of storage units. This set of storage units functions as a single unified storage system, and balances the capacity and performance load across the distributed components. A cache accelerated distributed storage design along with efficiency and reliability features can provide a higher level of determinism in terms of quality of service and performance. The ability to converge compute and storage significantly simplifies the management and reduces both the capital cost as well as the operational cost.

In one embodiment, the capacity and performance of a storage system can be increased in two ways: scale-up and/or scale-out. Scaling-up refers to adding more resources (e.g. storage, compute, etc.) in the same physical storage unit. In this embodiment, there can be a limit up to which a system can be scaled up. Thus, further scaling requires adding more physical units that work in cohesion to provide increased capacity and performance. This is called scale-out and has been the motivation of many distributed storage system designs. In an ideal scale-out system, adding the resources increases the capacity and performance by the same ratio without impacting the reliability characteristics of the storage system. In practice, however, this ideal scale-out is hard to achieve. This is because previous distributed systems rely on a centralized component for synchronization of the distributed system's various tasks and managing/storing of the distributed system metadata. In one embodiment, this metadata is data that describes the distributed system and the location of users' data. This centralized metadata becomes the bottleneck because the centralized metadata distributed storage system is not able to scale beyond a certain limit.

In one embodiment, the StorFS system is a storage system that includes a plurality of storage nodes coupled together by an interconnection network. In this embodiment, the StorFS system provides a distributed storage of data to one or more local and/or remote applications that make use of the storage and/or storage services provided the StorFS system. In one embodiment, each of the storage nodes includes a storage controller that is used to manage storage requests of the local and/or remote applications using the storage. The storage controller can include a storage controller client (SC client), a storage controller server (SC server), or both the SC client and SC server. In one embodiment, the SC client handles and dispatches application storage requests to an SC server. The SC server handles the storage requests and can additionally perform storage services (e.g., synchronous and asynchronous replication, distributed data deduplication, distributed garbage collection, data flushing, and distributed recovery).

In another embodiment, the StorFS system uses the concept of virtual node (vNode) as the unit of data routing and management. In one embodiment, there are four types of vNode:
 Namespace vNode: A vNode that is associated with the routing and storage of the StorFS file system namespace (directory structure, file names, etc.) metadata.
 FileTree vNode: A vNode that is associated with the routing and storage of the StorFS 'File Tree' metadata. File tree metadata is used to locate the data on the persistent storage.
 Data vNode: A vNode that is associated with the routing and storage of the data
 Cache vNode: A vNode that is associated with the routing of the client IOs from SC client to one of the SC servers. Multiple cache vNodes are grouped together to form an abstraction called 'Write Log Group', where updates from the clients are logged.

Namespace and FileTree vNodes are collectively called metadata vNodes. In one embodiment, there is a one-to-one correspondence between the metadata vNodes and the cache vNodes; i.e. for every metadata vNode, there exists one and only one cache vNode. In another embodiment, there can be a many to one relationship between metadata vNodes and cache vNodes (and vice versa). The number of metadata and cache vNodes is specified as a configuration parameter during the cluster creation and this number remains fixed for the entire lifecycle of the cluster. In one embodiment, data vNodes are created on demand when new data is written to the StorFS system. For the purpose of resiliency and high availability, the StorFS system introduces enough redundancy (e.g., RAID-1) to recover from failures. The redundancy level is configurable based on user-defined policies.

Cache vNodes can only be placed on storage devices that allow fast random access like SSD, flash, NVRAM, etc. Data and metadata vNodes can be placed on any non-volatile persistent storage like HDD, SSD, etc.

The cluster resource manager (CRM) maintains a database that maps vNodes to their 'Mirror Set'. The mirror set defines the actual physical locations of the corresponding vNode.

$$V_i \rightarrow \{M_1, M_2 \ldots M_k\}, \text{ where } M\text{'s are the } k \text{ way mirrors of vNode } V_i \quad (1)$$

$$M_i = \{P_x, D_y, S_z\}$$

In one embodiment, a mirror is defined by the tuple $\{P_x, D_y, S_z\}$ where $P_x$, indicates the physical node, $D_y$ indicates the disk within that node and $S_z$, denotes the "Segment Stor" within the disk. In one embodiment, a "Segment Stor" is a thin provisioned logical partition in StorFS. One of the '$M_i$' in the mirror set is marked as 'primary' and is responsible for mirroring data/metadata to the other mirrors in the mirror set.

In one embodiment, the SC client dispatches storage requests from the applications to an SC server that stores the data referenced by the storage request. In this embodiment, the storage request includes an entity identifier that references the stored data and an offset that is an offset into that stored data. The entity identifier can be an iNode, a file descriptor, key-value pair identifier, etc. If the storage request is a write of data to the StorFS system, the SC client determines which of the plurality SC servers is to handle the write storage request. In one embodiment, the SC client computes the SC server to handle the write storage request using a deterministic placement function. In this embodiment, the deterministic placement function uses the input parameters to compute the virtual node that (or will) store the data referenced in the write storage request. In one embodiment, by using the deterministic placement function, the StorFS system does not need to store location metadata to determine the initial virtual node for the data in the request. Instead, the system stores metadata for the virtual node to the physical node conversion. With the virtual node identification, in one embodiment, the SC client determines the physical node identification and the SC server that corresponds to this physical node.

The SC server that stores the data referenced by the write storage request, receives this request. In one embodiment, the SC server stores this data in a write log by appending the data at the end of the write log. This can lead to a fast write for the data that allows a quick write storage fulfillment for the requesting application. In addition and in one embodiment, the SC server can synchronously replicate the data referenced in the write storage request. In this embodiment, the SC server determines the mirrors for this virtual node using a dynamic table that tracks the mirrors for each virtual node. In addition, the SC server sends the data to the SC servers that are used for the mirror virtual nodes.

In one embodiment, when the write log is full, the SC server flushes the write log to persistent storage. In this embodiment, for each virtual node that stores data in the full write log, the StorFS system determines new virtual node for that data and sends the data to the SC server that corresponds to the new virtual node. The SC server stores this data in persistent storage. In addition, the StorFS system can determine if the data that is stored in the write log for that virtual node is a duplicate of some other data stored elsewhere in the StorFS system. In one embodiment, during the flushing operation, the StorFS system determines if an entity is stored elsewhere by using a deduplication hints table. In one embodiment, the hints table stores characteristics of the top-K storage entities in the StorFS system. If there is a match with the entity being flushed, the StorFS system updates the metadata for this entity, but does not flush the entity to the persistent storage. If not, the StorFS system flushes the entity to persistent storage.

In one embodiment, during a flush to persistent storage, the StorFS system can asynchronously replicate each virtual node in the write log. In this embodiment, the StorFS system determines the mirrors of the virtual node and asynchronously sends the data and metadata of that virtual node to the mirror virtual nodes. In one embodiment, the StorFS system transfers the data and metadata of the virtual node as a large bulk transfer so that this data transfer is more efficient.

In addition to the write operations of the StorFS system outlined above, the StorFS system can perform additional storage services on the stored data. In one embodiment, the StorFS system can perform distributed failure recovery, distributed deduplication, and distributed garbage collection. In one embodiment, a virtual node can have one or more mirror nodes, where each of the mirror nodes is stored in a different fault domain. If a component of the virtual node goes down and/or becomes unresponsive, a new virtual node is allocated. The StorFS copies the data and/or metadata for the failed virtual node from the one or more mirror virtual nodes to the newly allocated virtual node. In one embodiment, the StorFS copies the data from the mirror nodes in large segment, making the restoration of that virtual node more efficient.

Furthermore, in one embodiment, the StorFS system can perform distributed data deduplication. As described above, during a flushing of data from the write log to persistent storage, the StorFS system checks to determine if the data being moved is duplicated elsewhere in the StorFS system. The StorFS system uses a hints table to determine whether data is duplicated. In one embodiment, the hints table stores statistics about a partial set of data in the StorFS system. By using a partial set of data statistics, the StorFS can do the data deduplication check efficiently. The StorFS system creates the hints table by creating a live object map of the data stored in the StorFS system. Using this map, the StorFS system determines a top-K statistics on the data stored in the StorFS system and uses these statistics in the hints table. In one embodiment, there is a global hints table that is used by each of the SC servers to determine if data is being duplicated in the StorFS system. In one embodiment, the hints table map stores a fingerprint for a VBA of content stored in the StorFS system.

In one embodiment, the StorFS system stores data in logically sequential segments. As data is deleted, these segments become unreferenced and can be reused. In one embodiment, the StorFS system walks a metadata tree to determine which of the segments are not referenced. For each unreferenced segment, the StorFS system collects the unreferenced segments and makes the segments available for future use. In addition, these segments can be used for fast distributed recovery of a vNode that is hosted by component that fails. In one embodiment, if a component of the StorFS system fails, the StorFS system determines which vNodes are affected by component recovery. For each affected vNode, the StorFS system can either create a new mirror vNode and resync this new vNode or resync that affected vNode.

FIG. 1 is an illustration of one embodiment of a high-level view of StorFS system 100. In FIG. 1, the StorFS system 100 includes storage nodes 102A-C coupled by an interconnection network 116. While in one embodiment, three storage nodes 102A-C are illustrated as part of the StorFS system 100, in alternate embodiments, there can be more or less storage nodes. For example and in one embodiment, the StorFS system 100 can include up to several hundred storage nodes. In one embodiment, each storage node 102A-C includes a storage controller (SC) client (also called dispatcher) 108A-C, a storage controller (SC) server 110A-C, or both. The SC servers 110A-C manage their underlying storage (e.g., Hard disk drive (HDD), Solid state drives (SSD), PCIe flash, etc.) and collectively provide reliable and unified storage functionality to the SC clients. The SC client 108A-C processes input/output (I/O) requests from the applications that are local to its physical storage node and routes them to the appropriate SC servers for processing. For example and in one embodiment, SC client 108A can send an I/O request locally to SC Server 110A and/or remotely to SC Servers 110B or 110C. The system is capable of exposing many different interfaces to the application like file (e.g. NFS, CIFS), object, key-value, etc. In one embodiment, the storage node 102A-C can be server, blade server, personal computer, etc., or any other type of device capable of storing data. In one embodiment, the management server 112A-C is an agent that is used to communicate system management data and commands regarding the corresponding storage node 102A-C with the management client 114.

In one embodiment, the design of the StorFS system 100 distributes both the data and the metadata, and this system 100 does not require storing a complete global map for locating individual data blocks in our system. The responsibility of managing metadata is offloaded to each individual storage nodes 102A-C. In one embodiment, a cluster manager (CRM) resides on each SC Server 110 maintains some global metadata, which is small compared to the local metadata. In one embodiment, each logical file (or entity) is partitioned into equal sized "stripe units". The location of a stripe unit is determined based on a mathematical placement function Equation (1):

$$\text{Virtual\_Node\#} = \text{Hash}(\text{Entity}_{Id}, \text{Stripe\_Unit\#}) \% \text{ Total\_Vitual\_Nodes} \quad (2)$$

$$\text{Stripe\_Unit\#} = \frac{\text{offset}}{\text{Stripe\_Unit\_Size}} \% \text{ Stripe\_Unit\_Per\_Stripe}$$

The $\text{Entity}_{Id}$ is an identification of a storage entity that is to be operated upon, the Total_Virtual_Nodes is the total number of virtual nodes in the StorFS system 100, the offset is an offset into the storage entity, and the Stripe_Unit_Size is the size of each stripe unit in the StorFS system 100. The value Stripe_Unit_Per_Stripe is described further below. In one embodiment, the storage entity is data that is stored in the StorFS system 100. For example and in one embodiment, the storage entity could be a file, an object, key-value pair, etc. In this example, the $\text{Entity}_{Id}$ can be an iNode value, a file descriptor, an object identifier, key/value identifier, etc. In one embodiment, an input to a storage operation is the $\text{Entity}_{Id}$ and the offset (e.g., a write, read, query, create, delete, etc. operations). In this embodiment, the $\text{Entity}_{Id}$ is a globally unique identification.

In one embodiment, the StorFS 100 system receives the $\text{Entity}_{Id}$ and offset as input for each requested storage operation from an application 106A-C. In this embodiment, the StorFS system 100 uses the offset to compute a stripe unit number, Stripe_Unit#, based on the stripe unit size, Stripe_Unit_Size, and the number of virtual nodes that the entity can be spread across, Stripe_Unit_Per_Stripe. Using the stripe unit number and the entity identifier ($\text{Entity}_{Id}$), the StorFS system 100 computes the virtual node identifier. As described below, the StorFS system 100 uses a hash function to compute the virtual node identifier. With the virtual node identifier, the StorFS 100 can identify which physical node the storage entity is associated with and can route the request to the corresponding SC server 110A-C.

In one embodiment, each vNode is a collection of either one or more data or metadata objects. The StorFS system 100 does not store data and metadata in the same virtual node. This is because data and metadata may have different access patterns and quality of service (QoS) requirements. In one embodiment, a vNode does not span across two devices (e.g. a HDD). A single storage disk of a storage node 102A-C may contain multiple vNodes. In one embodiment, the placement function uses that a deterministic hashing function and that has good uniformity over the total number of virtual nodes. A hashing function as known in the art can be used (e.g., Jenkins hash, murmur hash, etc.). In one embodiment, the "Stripe_Unit_Per_Stripe" attribute determines the number of total virtual nodes that an entity can be spread across. This enables distributing and parallelizing the workload across multiple storage nodes (e.g., multiple SC servers 110A-C). In one embodiment, the StorFS system 100 uses a two-level indexing scheme that maps the logical address (e.g. offset within a file or an object) to a virtual block address (VBA) and from the VBAs to physical block address (PBA). In one embodiment, the VBA can be a tuple with following information:

VBA={vNode ID, volume ID, object ID, offset, fingerprint}

In this embodiment, the VBA is prefixed by the ID of the vNode in which they are stored. This vNode identifier (ID) is used by the SC client and other StorFS system 100 components to route the I/O to the correct cluster node. The physical location on the disk is determined based on the second index, which is local to a physical node. The volume (also known as datastore) ID, object ID and offset are optional items. They are used to preserve the spatial locality of the VBAs. In one embodiment, a VBA contains the 'fingerprint' of the object fragment it represents and is unique across the StorFS cluster. No two objects in the cluster will have the same VBA.

In one embodiment, the cluster manager (CRM) maintains a database of virtual node (vNode) to physical node (pNode) mapping. In this embodiment, each SC client and server caches the above mapping and computes the location of a particular data block using the above function in Equation (1). In this embodiment, the cluster manager need not be consulted for every I/O. Instead, the cluster manager is notified if there is any change in 'vNode' to 'pNode' mapping, which may happen due to node/disk failure, load balancing, etc. This allows the StorFS system to scale up and parallelize/distribute the workload to many different storage nodes. In addition, this provides a more deterministic routing behavior and quality of service. By distributing I/Os across different storage nodes, the workloads can take advantage of the caches in each of those nodes, thereby providing higher combined performance. Even if the application migrates (e.g. a virtual machine migrates in a virtualized environment), the routing logic can fetch the data from the appropriate storage nodes. Since the placement is done at the stripe unit granularity, access to data within a particular stripe unit goes to the same physical node. Access to two different stripe units may land in different physical nodes. The striping can be configured at different level (e.g. file, volume, etc.) Depending on the application settings, the size of a stripe unit can range from a few megabytes to a few hundred megabytes. In one embodiment, this can provide a good balance between fragmentation (for sequential file access) and load distribution.

In one embodiment, the distributed object layer provides a global distributed object namespace that is accessible over the network. At a very high level, distributed object layer provides two simple interfaces:

KV_Put (key, object)
object=KV_Get (key)

Figure 5:
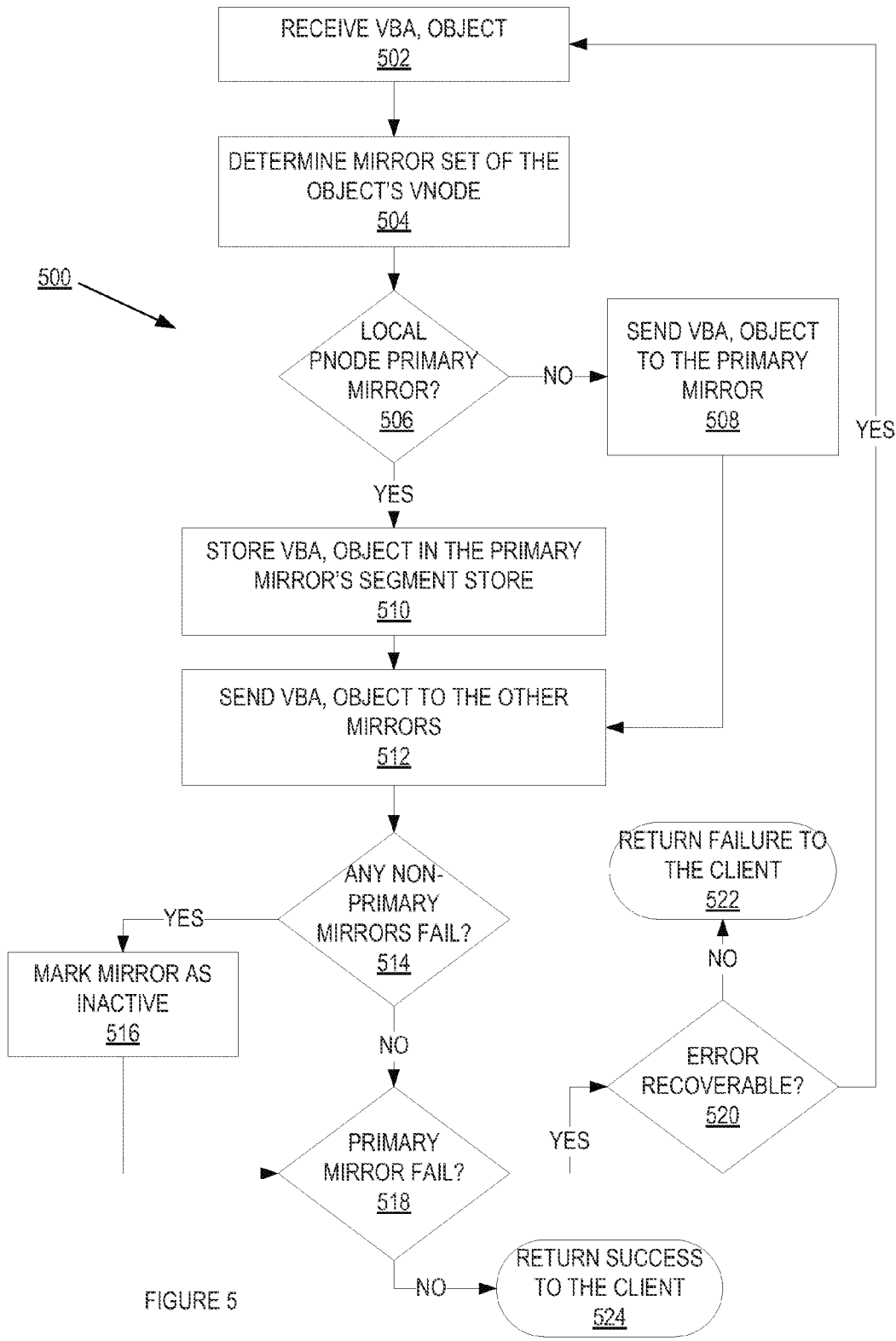
FIG. 5 is a flow diagram of one embodiment of a process for KV_put processing.
Figure 6:
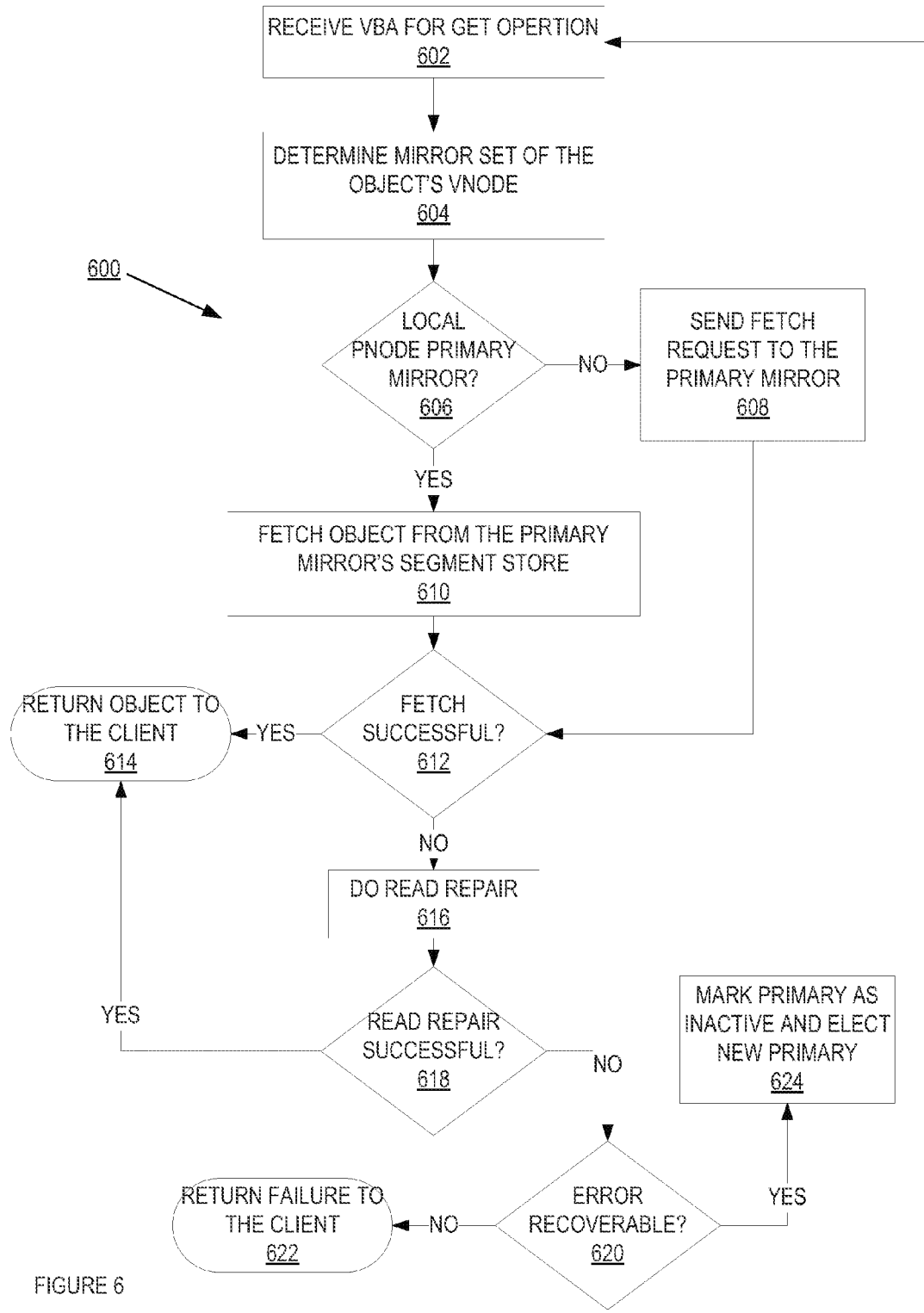
FIG. 6 is a flow diagram of one embodiment of a process for KV_get processing.

KV_Put and KV_Get are further described in FIGS. 5 and 6 below, respectively. In one embodiment, the key is the VBA that uniquely identifies the object and can be accessed from any storage control server in the cluster. In another embodiment, the key may be user-defined unique identifier. The distributed object layer routes the I/O requests to the storage control server that manages and stores the vNode indicated in the VBA. In one embodiment, the KV_Put interface is used to store an object referenced by the key. In one embodiment, the KV_Get interface is used to fetch an object referenced by the key.

Figure 2:
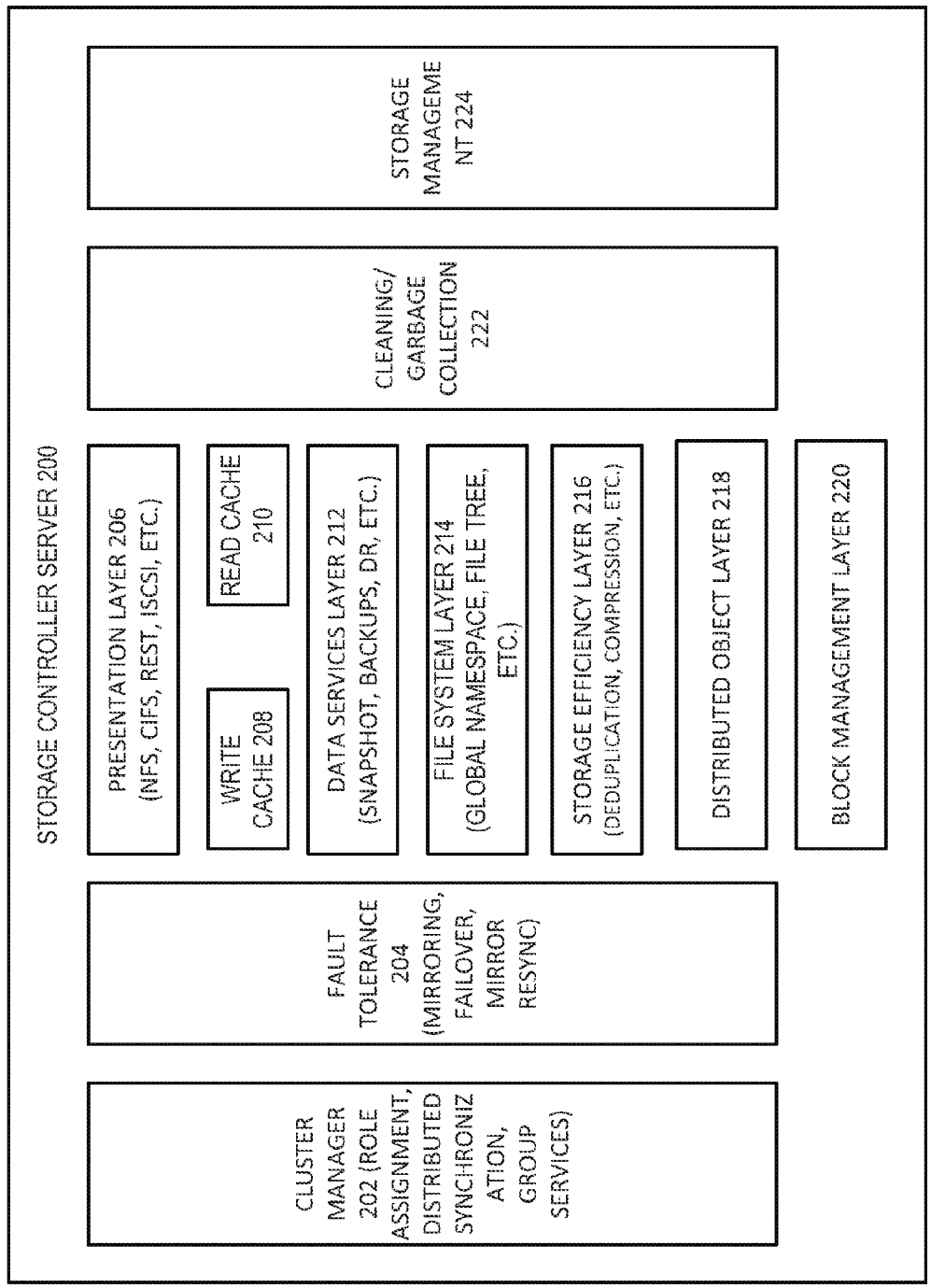
FIG. 2 is an illustration of one embodiment of a system including some of the components that comprises the storage controller server.

FIG. 2 is a block diagram of one embodiment of a storage control server 200. In one embodiment, the Block Management Layer 220 of the storage control server is responsible for formatting, allocating, and freeing storage in fixed block sizes. This layer provides access to different kinds of storage (e.g. SSD, HDD, etc.) in the system. In one embodiment, the Distributed Object Layer 218 of the storage control server uses an API of the Block Management Layer 220 to provide a global distributed object namespace that is accessible over the network. In one embodiment, the Storage Efficiency Layer 216 reduces the size of data footprint on the physical medium using techniques like compression, deduplication, etc. The reduction is achieved without deteriorating the performance or the reliability of the data storage. In one embodiment, the File System Layer 214 provides a logical global namespace abstraction to organize and locate data in the cluster. In one embodiment, the Data Service Layer 212 provides enterprise data services like disaster recovery, fine grained policy management, snapshots/clones, etc. In one embodiment, the Write Cache 208 and the Read Cache 210 Layers provide acceleration for write and read I/O respectively using fast storage devices. In one embodiment, the Write Cache Layers 208 includes the write log as described below. In one embodiment, the Presentation Layer 206 provides an interface to access the StorFS storage using well-known standard protocols like NFS, CIFS, REST, iSCSI, and/or another storage standard. In one embodiment, the Cluster Manager (CRM) Layer 202 is responsible for the coordination across distributed StorFS components, delegating responsibilities and maintaining a consistent global state of the system. In one embodiment, the Fault Tolerance Layer 204 is responsible for resiliency and making sure that the data is available and consistent even after the failure of a software or hardware component (disk, server, network, etc.). In one embodiment, the Garbage Collection Layer 222 is responsible for reclaiming dead space that result due to entities getting deleted or updated. This layer efficiently determines the storage blocks that are not used (or referenced) and makes them available for new data to be written. In one embodiment, the Storage Management Layer 224 provides a framework to configure, monitor, analyze and report on the operation of the overall StorFS cluster storage system as well as individual logical and physical entities in the cluster. In one embodiment, each of the layers mentioned above are fully distributed and each layer does not rely on any centralized components for their operations.

Figure 4:
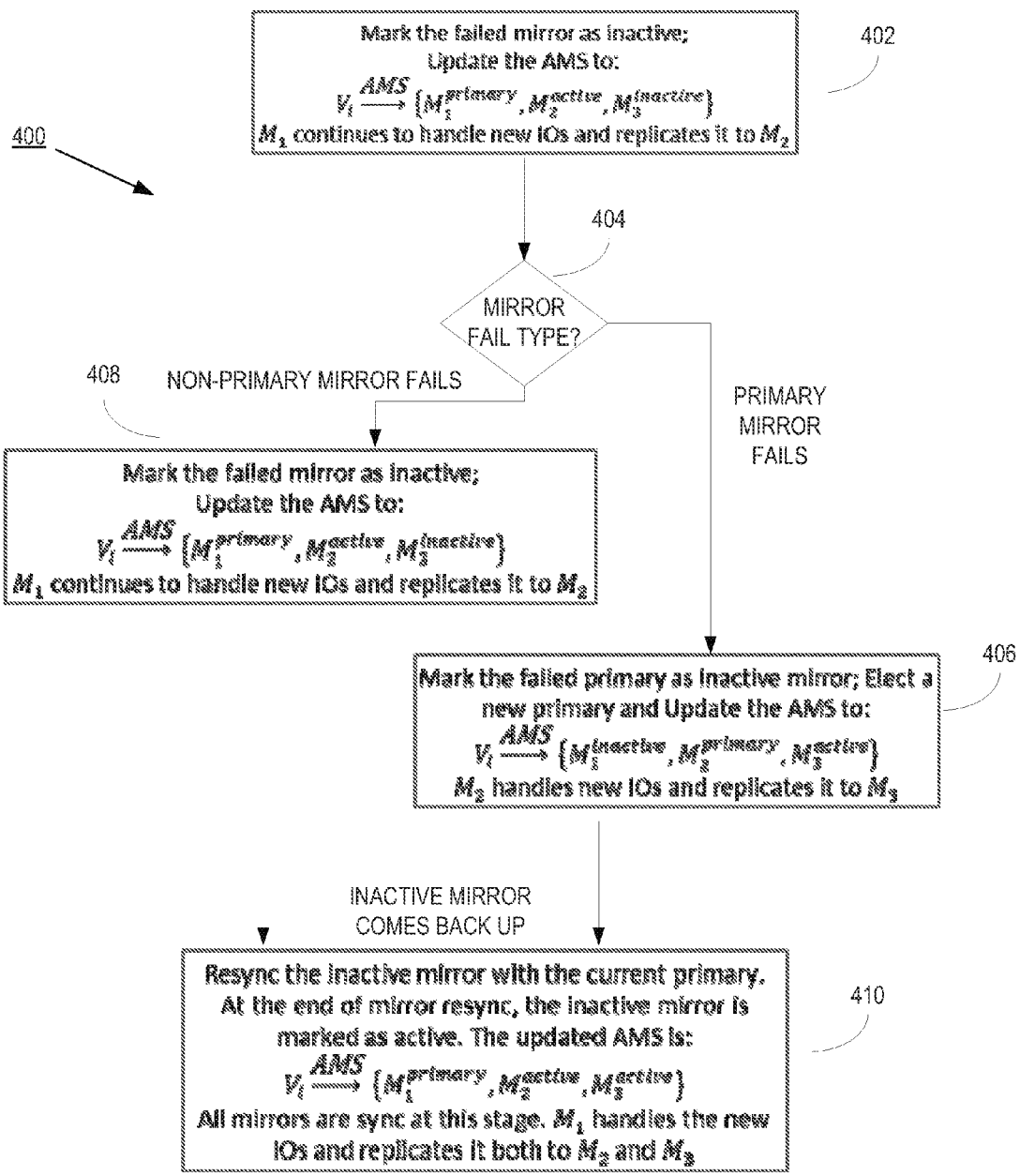
FIG. 4 is a flow diagram of one embodiment of a process for Active Mirror Set (AMS) management with strong consistency and high availability.

FIG. 4 is a flow diagram of one embodiment of a process 400 for Active Mirror Set (AMS) management with strong consistency and high availability. In one embodiment, process 400 is performed by the cluster resource manager 202 as described in FIG. 2 above. In FIG. 4, process 400 creates an AMS for the vNode ($V_i$). In one embodiment, the AMS is a mirror set for the vNode associated with the write log entry. In this embodiment, the AMS includes one or more mirrors that are used to replicate the data and metadata of that vNode. In one embodiment, the AMS for the vNode $V_i$ is:

$$V_i \rightarrow \{M_1^{primary}, M_2^{active}, M_3^{active}\} \quad (3)$$

With this AMS for $V_i$, the primary mirror $M_1^{primary}$ handles the new I/O and replicates the I/O to the other mirrors in the AMS, $M_2^{active}$ and $M_3^{active}$. At block 404, process 400 determines the type of mirror that failed (e.g., a primary or the non-primary mirror failure). In one embodiment, one of these mirrors may fail because of a disk failure, node failure and/or rack failure. If the primary mirror fails, at block 406, process 400 marks the failed mirror as an inactive mirror. With the inactive mirror as part of the AMS, process 400 elects a new primary and updates the AMS for $V_i$. In this embodiment, the AMS for $V_i$ will be:

$$V_i \rightarrow \{M_1^{inactive}, M_2^{primary}, M_3^{active}\} \quad (4)$$

In this embodiment, $M_2^{primary}$ handles the new I/O and replicates the new I/O to $M_3^{active}$. In addition, since the $M_1^{inactive}$ is inactive, $M_2^{primary}$ does not replicate the new I/O to the inactive mirror. Execution proceeds to block 410 below.

If a non-primary fails, at block 408, process 400 marks the failed mirror as inactive and updates the AMS for $V_i$. In this embodiment, the AMS for $V_i$ will be:

$$V_i \rightarrow \{M_1^{primary}, M_2^{active}, M_3^{inactive}\} \quad (5)$$

In this embodiment, $M_1^{primary}$ continues to handle the new I/O and replicates the new I/O to $M_3^{active}$. In addition, since the $M_1^{inactive}$ is inactive, $M_2^{primary}$ does not replicate the new I/O to the inactive mirror. Execution proceeds to block 410 below.

At block 410, process 400 detects that the inactive mirror has come back up. In one embodiment, process 400 resynchronizes the inactive mirror with the current primary. In one embodiment, process 400 resynchronizes the inactive mirror by copying over segments missing in the inactive mirror from one or more active mirrors. For example and in one embodiment, process 400 resynchronizes the inactive mirror as described in FIG. 12 below. In one embodiment, at the end of the mirror resync, process 400 marks the inactive mirror as active. In this embodiment, the updated AMS or $V_i$ will be:

$$V_i \rightarrow \{M_1^{primary}, M_2^{active}, M_3^{active}\} \quad (6)$$

In this embodiment, at the end of the mirror resync, the inactive mirror is marked as active. The mirrors are in sync at this stage. In this embodiment, $M_1^{primary}$ handle the new I/O and replicates the new I/O to $M_2^{active}$ and $M_3^{active}$.

As described above, the StorFS system provides an interface, KV_put, to store an object referenced by a key. FIG. 5 is a flow diagram of one embodiment of a process 500 for KV_put processing. In one embodiment, process 500 is performed by the distributed object layer 218 as described in FIG. 2 above. In FIG. 5, process 500 begins by receiving the VBA and the object that is to be stored at block 502. In one embodiment, the VBA is the key used to reference the object. At block 504, process 500 determines the mirror set of the object's vNode. In one embodiment, the object's vNode is determined from the input VBA received at block 502. For example and in one embodiment, the VBA received includes the vNode as one of the elements of the tuple for the VBA.

Process 500 determines if the local pNode is the primary mirror of the determined vNode at block 506. In one embodiment, the local pNode can be determined if this pNode corresponds to the primary mirror based on the vNode for the VBA and a pNode/vNode correspondence table. If the local pNode is not the primary, process 500 sends the VBA and object to the primary mirror at block 508. In one embodiment, by sending the VBA and object, the target pNode can store the object at the VBA. Execution proceeds to block 512 below. If the local pNode is the primary mirror, store the VBA and object in the primary's segment store. In one embodiment, the segment store is a "Segment Stor," described above, that is a thin provisioned logical partition in StorFS. In one embodiment, the data in the mirrors is stored by segment, which allows for efficient storage of the content for that vNode. Execution proceeds to block 512 below.

At block 512, process 500 sends the VBA and object to the other mirrors. In one embodiment, process 500 sends the VBA and object to the active mirrors of the AMS of the vNode for the object. By sending the VBA and object to the active mirrors, process 500 provides data replication for each object store. Process 500 determines if any of the non-primary mirrors failed in response to the VBA and object being sent to them. If a non-primary mirror failed, process 500 marks that non-primary mirror as inactive. In one embodiment, the StorFS system attempts to recover the inactive mirror as described above. Execution proceeds to block 518 below. If none of non-primary mirrors fail, execution proceeds to block 518 below.

At block 518, process 500 determines if the primary mirror failed. If the primary mirror did not fail in response to the store attempt, process 500 returns success to the client at block 524. If the primary mirror did fail, at block 520, process 500 determines if the error is recoverable. An error is recoverable if there is an active mirror other than the failed primary available. If the error is recoverable, execution proceeds to block 504, in which process 500 repeats the put process. If the error is not recoverable, process 500 returns a failure to the client.

As described above, the StorFS system can additionally provide an interface, KV_get, to fetch an object referenced by a key. FIG. 6 is a flow diagram of one embodiment of a process 600 for KV_get processing. In one embodiment, process 600 is performed by the distributed object layer 218 as described in FIG. 2 above. In FIG. 6, process 600 begins by receiving the VBA for the object that is to be retrieved at block 602. In one embodiment, the VBA is the key used to reference the object. At block 604, process 600 determines the mirror set of the object's vNode. In one embodiment, the object's vNode is determined from the input VBA received at block 602. For example and in one embodiment, the VBA received includes the vNode as one of the elements of the tuple for the VBA.

Process 600 determines if the local pNode is the primary mirror of the determined vNode at block 606. In one embodiment, the local pNode can be determined if this pNode corresponds to the primary mirror based on the vNode for the VBA and a pNode/vNode correspondence table (e.g., the CRM routing table). If the local pNode is not the primary, process 600 sends the request for object to the primary mirror at block 608. Execution proceeds to block 612 below. If the local pNode is the primary mirror, process 600 fetches the object from the primary's segment store. In one embodiment, the segment store is the uniform framework to manage different kind of storage devices and abstracts out the complexity of low-level block management from the upper layers in the StorFS software stack. Execution proceeds to block 612 below.

At block 612, process 600 determines if the fetch was successful. In one embodiment, process 600 determines if the fetch is successful by examining a return code associated with fetch attempt. If the fetch is successful, process 600 returns the object to the client at block 614. If the fetch is not successful, process 600 attempts a read repair at block 616. In one embodiment, read repair involves fetching data from an active mirror and 'repairing' the primary mirror with the fetched data. Process 600 determines if the read repair is successful at block 618. If the read repair is successful, the object is fetched and process 600 returns the object to the client at block 614 as described above.

If the read repair is not successful, at block 620, process 600 determines if the error is recoverable. In one embodiment, process 600 determines that the error is recoverable by determining whether there is an alternative active mirror from where data can be fetched. If the error is recoverable, process 600 marks the primary mirror as inactive and elects a new primary at block 624. In one embodiment, by electing a new primary, process 600 can use this primary to do another fetch of the object. Execution proceeds to block 604 above in which process 600 attempts the fetch using the newly elected primary. If the error is not recoverable, process 600 returns a failure at block 622.

Figure 8:
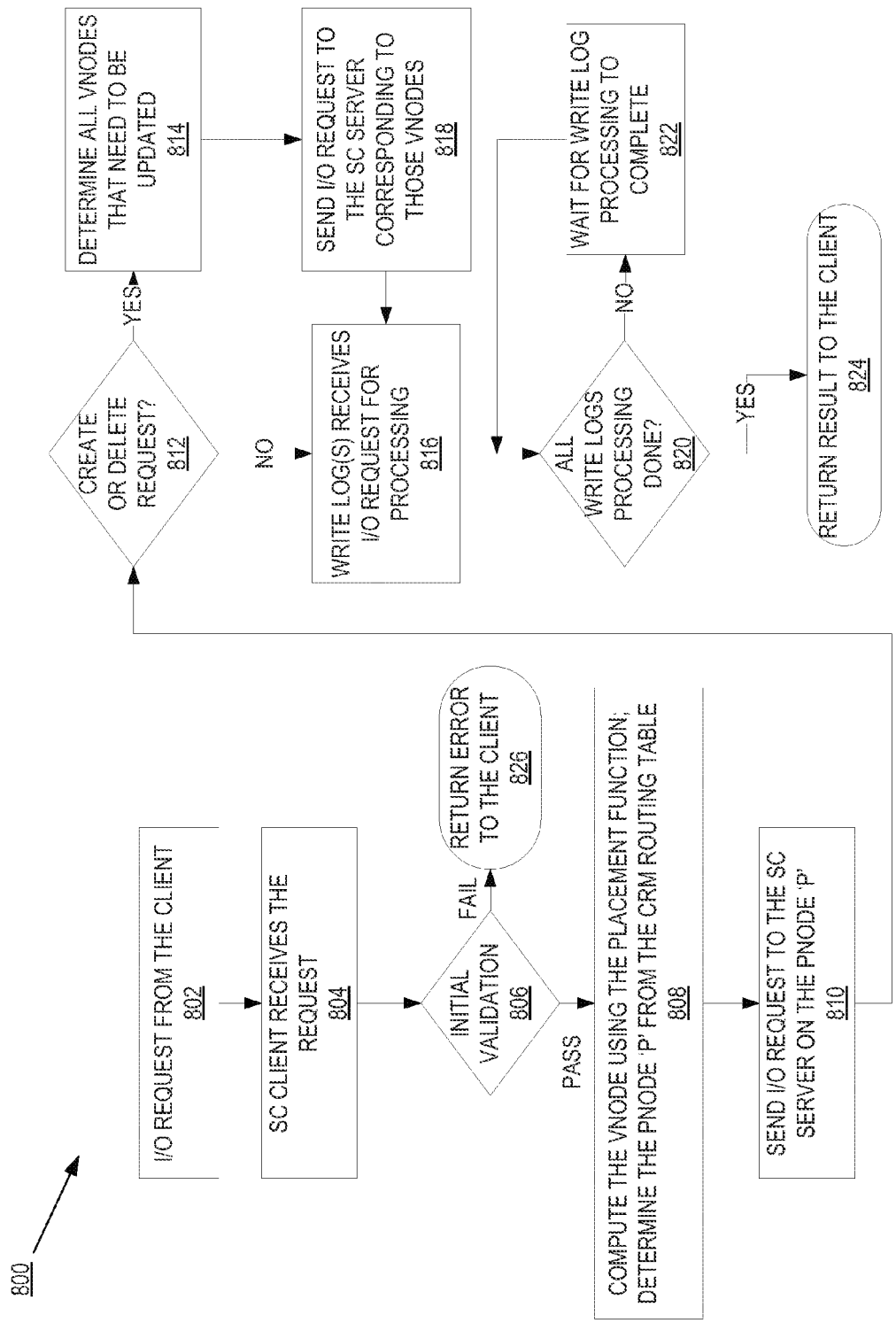
FIG. 8 is a flow diagram of one embodiment of a process to perform input/output processing.

FIG. 8 is an illustration of one embodiment of a process 800 to perform input/output processing. In one embodiment, process 800 is performed by the Storage Controller 104 of FIG. 1. In FIG. 8, process 800 begins by receiving an input/output request from a client at block 802. In one embodiment, the client can be an application that uses the StorFS system, such as applications 86A-D as described in FIG. 1 above. In one embodiment, the I/O request can be a request to read content from the StorFS system, write content to the StorFS system, and/or request status of content stored in the StorFS system. At block 804, process 800 validates the input/output request. In one embodiment, validation may comprise of simple I/O attributes consistency check, permission checks, admission control, etc. If the request is not validated, at block 806, process 800 return an error to the requesting client (e.g., error code, throws an exception, etc.). If the request is validated, at block 808, process 80 computes the vNode for the input/output request using the placement function. In one embodiment, process 800 uses Equation (1) described above to compute the vNode for the I/O request. In addition, process 800 determines the pNode corresponding to the determined vNode. In one embodiment, process 800 determines the corresponding pNode using the CRM routing table as described above with reference to FIG. 2 above.

At block 810, process 800 sends the input/put request to SC server on the corresponding pNode. For example and in one embodiment, if process 800 executing on SC client 88A on physical server 82A and the corresponding pNode is on the SC Server 18C of physical server 82C, process 800 sends the input/output request to the SC server 18C on physical server 82C. At block 812, process 800 determines if the input/output request is related to creating or deleting an entity. In one embodiment, an entity is data that is stored in the StorFS system 80. For example and in one embodiment, the entity could be a file, an object, key/value pair, etc. If the request is not related to creating or deleting an entity, execution proceeds to block 816 below. If the I/O request is related to creating or deleting an entity, at block 814, process 800 determines which of the vNodes need to be updated. In one embodiment, process 800 determines the vNodes to be updated by computing all the vNodes that the entity can reside using the placement function (Equation (1)). At block 818, process 800 sends the input/output request to the SC server that corresponds to the vNodes determined at block 814.

At block 816, process 800 receives an I/O request for write log processing. Process 800 determines if the write log processing is complete at block 820. If the write log processing is not complete, at block 822, process 800 wait for the write log processing to complete and execution proceeds to block 820. If the write log processing is complete, process 800 returns.

In one embodiment, an application can use some type of middleware libraries to access networked storage. For example and in one embodiment, virtual machines may use the hypervisor's built-in NFS client or iSCSI client to access backend storage. In a clustered environment, the goal of this middleware is not only to provide connectivity to backend storage but also availability by failing over to other cluster nodes in case of failure. In one embodiment, the StorFS system uses an intelligent I/O dispatcher that intercepts I/O requests from the client (e.g. NFS Client running inside a hypervisor) and directs them to appropriate cluster nodes. In one embodiment, the I/O dispatching is performed by a SC Client, such as SC Client 108A-C as described in FIG. 1 above. In one embodiment, there are three modes of operation: i) I/O requests are routed to the SC Client running on the same physical node (i.e. to 'localhost'); ii) A common FQDN (Fully Qualified Domain Name) entry for the cluster pointing to the localhost' or '127.0.0.1' is created in the DNS configuration file (typically /etc/hosts) of each cluster nodes; and iii) Intercepting and rerouting incoming I/O requests using software-based routing mechanism like DVS (Distributed Virtual Switch) and "Network Service Insertion" framework available in many popular virtualization platforms (e.g. VMware).

Log Structured Sequential Storage Layout

In one embodiment, the Log structured sequential storage layout provides an efficient use of SSD and HDD I/O bandwidth available for incoming writes. In this embodiment, both the data and metadata are written to a new disk location as opposed to rewriting them at their old location. This layout transforms the incoming random I/O traffic to large sequential writes in the backend of the physical storage media (e.g., HDD, SDD, flash, etc.). In addition, this layout not only increases the write performance, but also enables many kinds of data services, provides protection from accidental deletes, etc. This layout additionally increases the SSDs lifetime by writing in large erase cycle blocks. However, a problem with the log structured layout is fragmentation of the physical storage media. This may not be a big problem in SSDs because of their high random I/O performance, but fragmentation can deteriorate performance in case of HDD spindles. In addition, Log structured log enables variable-sized chunks to be stored in it. This enables compression and deduplication of data blocks and stores them tightly on the storage media without any alignment restriction (like sector alignment, etc.).

As mentioned earlier, the StorFS system uses a two-level indexing scheme that maps the logical address to a virtual block address (VBA) and from the VBAs to physical block address (PBA). The system allows for objects with contiguous VBAs to be stored close to each other. This addressing scheme further enables fast lookup of objects from the underlying media and reduces defragmentation significantly. As described above, VBAs are unique across the StorFS cluster and no two objects in the cluster will have the same VBA.

Figure 7:
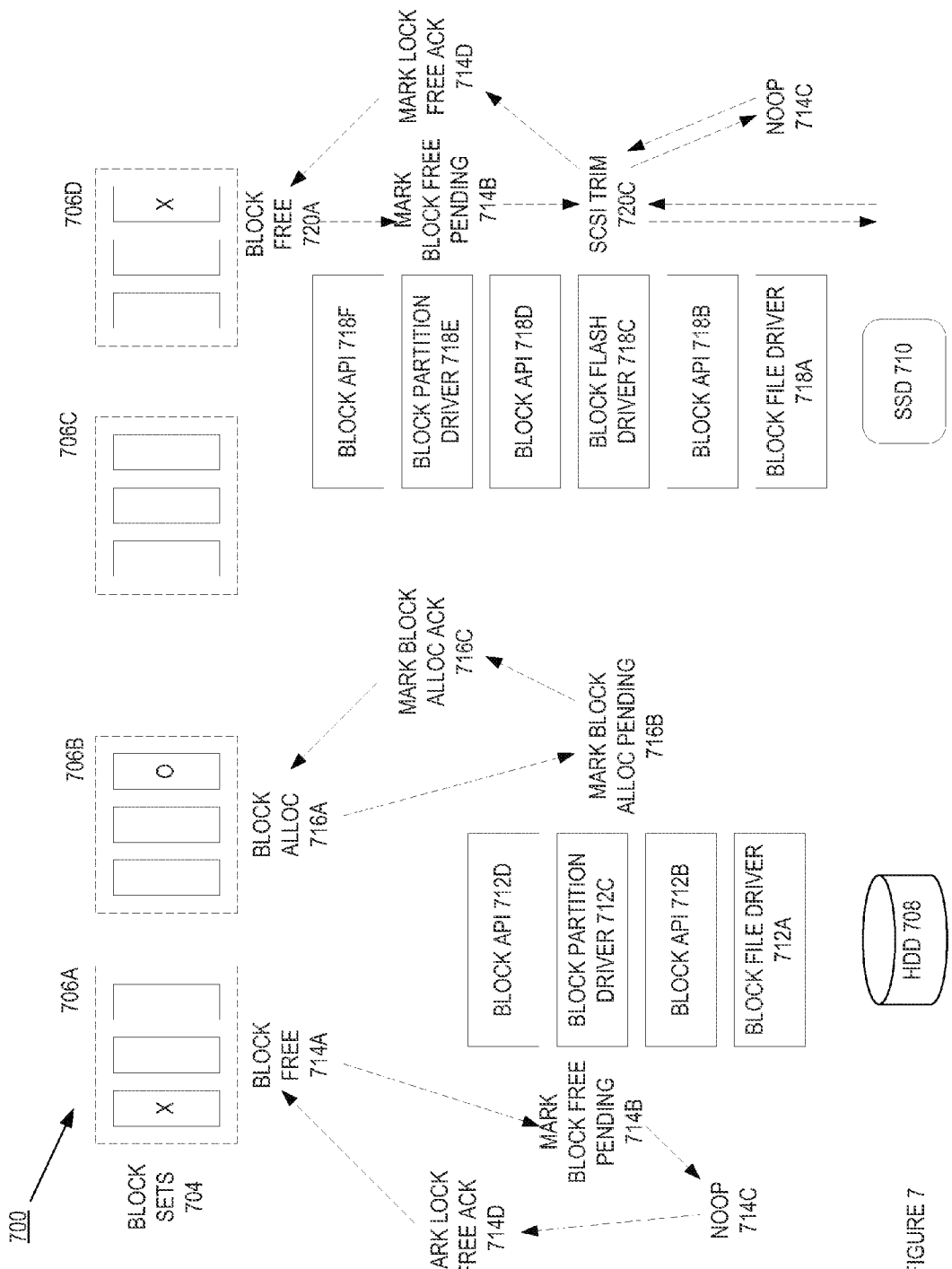
FIG. 7 is an illustration of one embodiment of the Block Management layer.

FIG. 7 is an illustration of one embodiment of the Block Management layer 700. In FIG. 7, the detailed software stack of the Block Management Layer 700 is illustrated. The Block Storage API provides a standardized interface to create a "Block Set" 704, allocate/free blocks within a Block Set 704, perform IO to blocks, etc. This is accomplished by invoking an internal block driver API. Block drivers can provide different behaviors and, if the bottom of the driver itself calls the standard Block Storage API, drivers may be stacked one on top of another. For example, in FIG. 7, block API 712D is stacked upon Block Partition Driver 712C, which is stacked upon another Block API 712B and Block File Driver 712A. For freeing an HDD block 714A, the block partition driver 712C marks the freed block as "free pending" and invokes the API provided by the block file driver 712A to return the freed block. The block file driver, in this case, does no operation (NOOP 714C) on it and returns success to the partition driver, which finally marks the block as "free acknowledged" 714D and returns back to the client that invoked the original request.

When creating/opening a Block Set, a hierarchical path can be specified prepended with the string "<driverName>:" to indicate which driver should be used. If no driver name is specified, the Block File ("file:") driver 712A is assumed and the path is treated as a standard Unix file or device. The Block File driver splits the file into fixed sized blocks and exports a single Block Set with all physical blocks allocated with physical block numbering (0–(numBlocks–1)). The Block Partition driver ("part:") 712C can be stacked on top of the Block File 712A driver to allow a single physical disk Block Set to be partitioned into multiple Block Sets.

In one embodiment, the Block Flash driver ("flash:") 718C can be stacked between the Block Partition 718E and File 718A drivers to provide flash specific semantics such as I/O scheduling (e.g. limiting the number of concurrent writes, preventing concurrent reads/writes, etc.) and invoking "TRIM" on block free. In one embodiment, freeing a flash-based block 720A is similar to freeing an HDD-based block 714A, except that, in this embodiment, the block flash driver gets invoked for the free request, which performs a "SCSI TRIM" 720C before invoking the block file driver. In one embodiment, a TRIM releases and prepares the specified region of a flash-based device for future writes.

In one embodiment, the segment store uses the block abstraction to build collections of ordered segments. Each segment within a Segment Store is uniquely identified by its 'logical id', which is a monotonically increasing 64-bit number. This provides a uniform framework to manage different kind of storage devices and abstracts out the complexity of low-level block management from the upper layers in the StorFS software stack.

In one embodiment, both the data and metadata are distributed as well as replicated, which allows for recovery in case of failure. In one embodiment, the replication is performed across different 'fault domains' so that a failure of a component in one domain does not impact the availability of components in other domains. A set of HDDs, server nodes, or a physical server rack is a few examples of fault domain. This allows the StorFS system to tolerate different kind of failures: disk failures, node failures and/or rack failures. Replication of data, however, can impose a cost on a storage system. For example, replication can impose significant overhead in terms of capacity and steady state performance.

Figure 3:
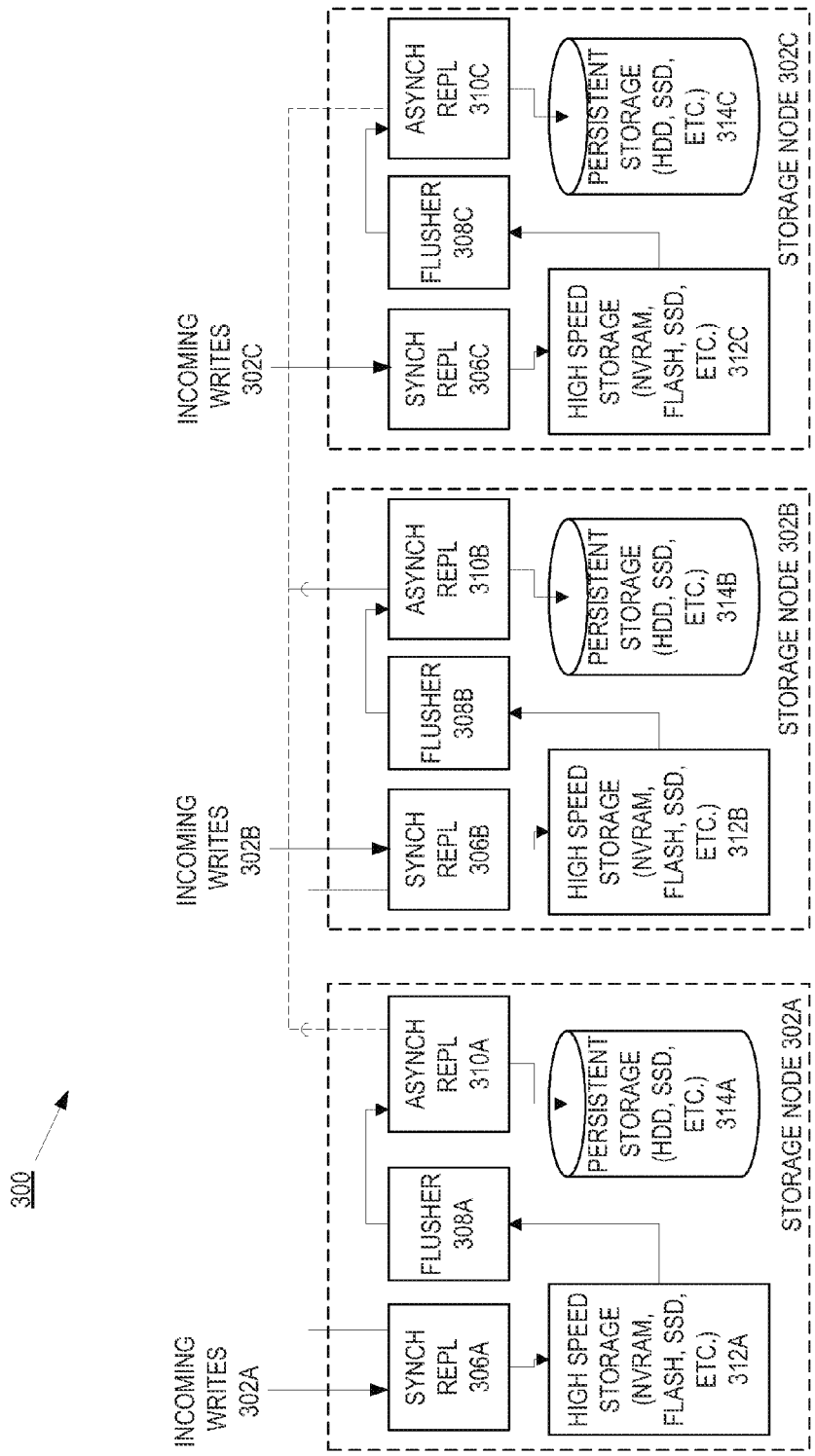
FIG. 3 is an illustration of one embodiment of an efficient distributed replication.

FIG. 3 is an illustration of one embodiment of an efficient distributed replication. In FIG. 3, the system 300 uses a combination of synchronous and asynchronous techniques to efficiently replicate data across the cluster. In one embodiment, storage nodes of SC servers 302A-C can each receive an incoming client write 304A-C. In one embodiment, the storage node 302A receives the incoming client write with synchronous replicate module 306A. The synchronous replicate module 306A receives the write 304A and stores the contents of the write in the high-speed storage 312A (e.g., NVRAM, Flash, SSD, etc.). In one embodiment, the synchronous replicate module 306A stores the write contents at the backend of the high-speed storage 312A as described above. A flusher module 308A flushes the contents of the write to the asynchronous replication module 310A. In one embodiment, the flusher module 308A flushes the contents on to the persistent storage.

In one embodiment, the asynchronous replication module 310A stores the content to persistent storage 314A. In this embodiment, the asynchronous replication module 310A can additionally replicate this content to the other storage nodes 302B-C via the asynchronous replication modules 310B-C, respectively. These receiving asynchronous replication modules 310B-C, each store the content in the corresponding local perspective storage 314B-C, respectively.

To facilitate replication, the block storage layer generates a unique monotonically increasing logical ID for the data/metadata segment system 300 writes. The replication engine uses these logical IDs to synchronize large chunks of segments across different mirrors. This scheme eliminates the need of expensive distributed coordination, metadata comparison, and/or read-modify-write to replicate data and metadata. New incoming writes are logged and synchronously replicated in SSDs or other high-speed storage medium. Periodically, a 'flusher' 308A-C moves the logged content asynchronously from the high-speed storage to its permanent location for persistence.

Figure 9:
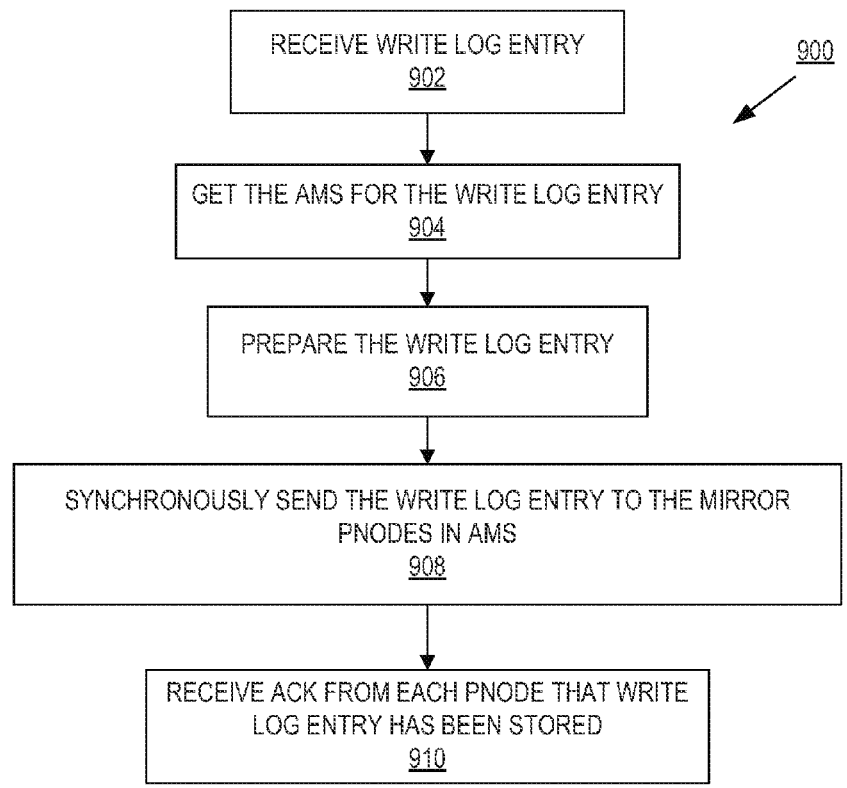
FIG. 9 is a flow diagram of one embodiment of a process to perform synchronous mirroring.

As described above, the StorFS system can perform synchronous replication of the data being stored in the in the write log. FIG. 9 is a flow diagram of one embodiment of a process 900 to perform synchronous replication of a write log entry. In one embodiment, process 900 is performed by process 500 at block 512 of FIG. 5 above to perform this synchronous replication. In FIG. 9, process 900 begins by receiving the write log entry at block 902. In one embodiment, the write log entry is an entry to store an entity in the write log. At block 904, process 900 gets an active mirror set (AMS) for the write log entry. In one embodiment, the AMS is a mirror vNode set for the vNode associated with the write log entry. In this embodiment, the AMS includes this vNode and one or more active vNodes that is used to replicate the data and metadata of that vNode. Process 900 prepares the write log entry at block 906. In one embodiment, the write log entry consists of vNode ID, timestamp, checksum and other metadata along with the incoming data from the SC client.

At block 908, process 900 synchronously sends the write log entry to the pNodes that correspond to the mirror vNodes. In one embodiment, process 900 determines the corresponding SC server for each mirror vNode by looking up the corresponding pNodes in a vNode to pNode mapping table via the CRM. In one embodiment, the write log entry is synchronous so that the success of the writing to the write log can be acknowledged to the requesting client. In this embodiment, a synchronous write allows that the data is reliably stored before write is acknowledged to the client. At block 910, process 900 receives an acknowledgement from each pNode. While in one embodiment, there is one SC server for each pNode, in alternate embodiments there can be more than one SC server for each pNode. In one embodiment, the acknowledgement indicates the write log entry have been stored at the corresponding pNode.

Figure 10:
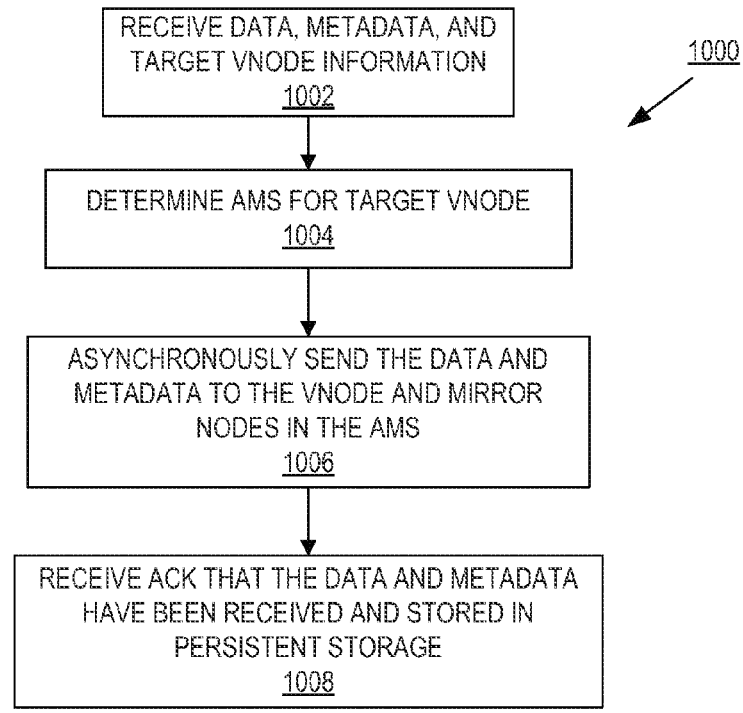
FIG. 10 is a flow diagram of one embodiment of a process to asynchronously mirror data and metadata.

As described above, the flusher asynchronously sends data and metadata to the target vNode and the mirror nodes to replicate the data and metadata being moved to persistent storage. FIG. 10 is a flow diagram of one embodiment of a process 1000 to asynchronously replicate data and metadata. In FIG. 10, process 1000 begins by receiving the data and the metadata, for each target vNode for the asynchronous replication at block 1002. In one embodiment, the asynchronous replication is on a vNode by vNode basis. In this embodiment, the asynchronous replication can include a replication of one or more vNodes. In one embodiment, each vNode may contain a few bytes or up to several megabytes or greater.

At block 1004, process 1000 determines an AMS for the target vNode. In one embodiment, the AMS for a target node includes the target vNode and one or more active replica vNodes that are used to store the replication data and metadata for the target vNode. The AMS is described further below. Process 1000 asynchronously sends the data and metadata for that vNode to the target vNode and other mirror nodes in the AMS at block 1006. In one embodiment, an asynchronous send of the data is one where the send is sent to the SC server that corresponds to the vNode receiving the data and control is returned to process 1000 before the receiving SC server completes the write. In one embodiment, the receiving SC server receives the data and metadata and stores this content in the persistent storage of the SC server. After this storing of the data, the SC server sends an acknowledgement to process 1000. At block 1008, process 1000 sends an acknowledgement that the data and metadata has been stored. In one embodiment, process 1100 completes when the process has received the acknowledgements for each of the issued writes.

In a typical replication based system, strong consistency is obtained by enforcing the following:

$$(R+W)>N \quad (4)$$

where 'R' and 'W' are the minimum number of replicas that must respond correctly to a 'read' and 'write' respectively, N is the total number of replicas. The value of N does not change once it has been set. This implies that if there are three replicas, R+W must always be greater than 3. In one embodiment, the StorFS system relaxes this requirement and yet provides strong consistency guarantee. For each vNode, the CRM maintains an Active Mirror Set (AMS), which defines the currently active replicas for that vNode. If a replica goes out of sync (e.g. because of failure, etc.), the replica is dropped from AMS. If a replica comes back up, the replica syncs with the corresponding replicas in the AMS and is added back to AMS upon full resynchronization (as referred to as a "resync"). The modified requirement for strong consistency in StorFS is:

$$(R+W)>|AMS| \quad (5)$$

where |AMS| is the cardinality of the AMS corresponding to a vNode. Thus the, variable sized AMS can provide greater service availability because of the less stringent requirements and without compromising strong consistency guarantees. The AMS is further described in FIG. 4 below.

In one embodiment, the StorFS system is designed to handle multiple failures. When such a failure happens, the StorFS system recovers from multiple sources in parallel, which significantly reduces the total recovery time. This distributed recovery is made possible in part due to our placement logic that enables the mirrors to find different location of the replicas and stream large chunk of data from those replicas. Also, if a particular replica lags behind the "primary" replica because of failures, system reboot, etc., the StorFS system can resynchronize itself with other active replicas by fetching those segments whose logical IDs are greater than the ones it has. In this embodiment, there is no need to perform an expensive "diff-and-merge" operation across the distributed set of replicas.

Figure 11:
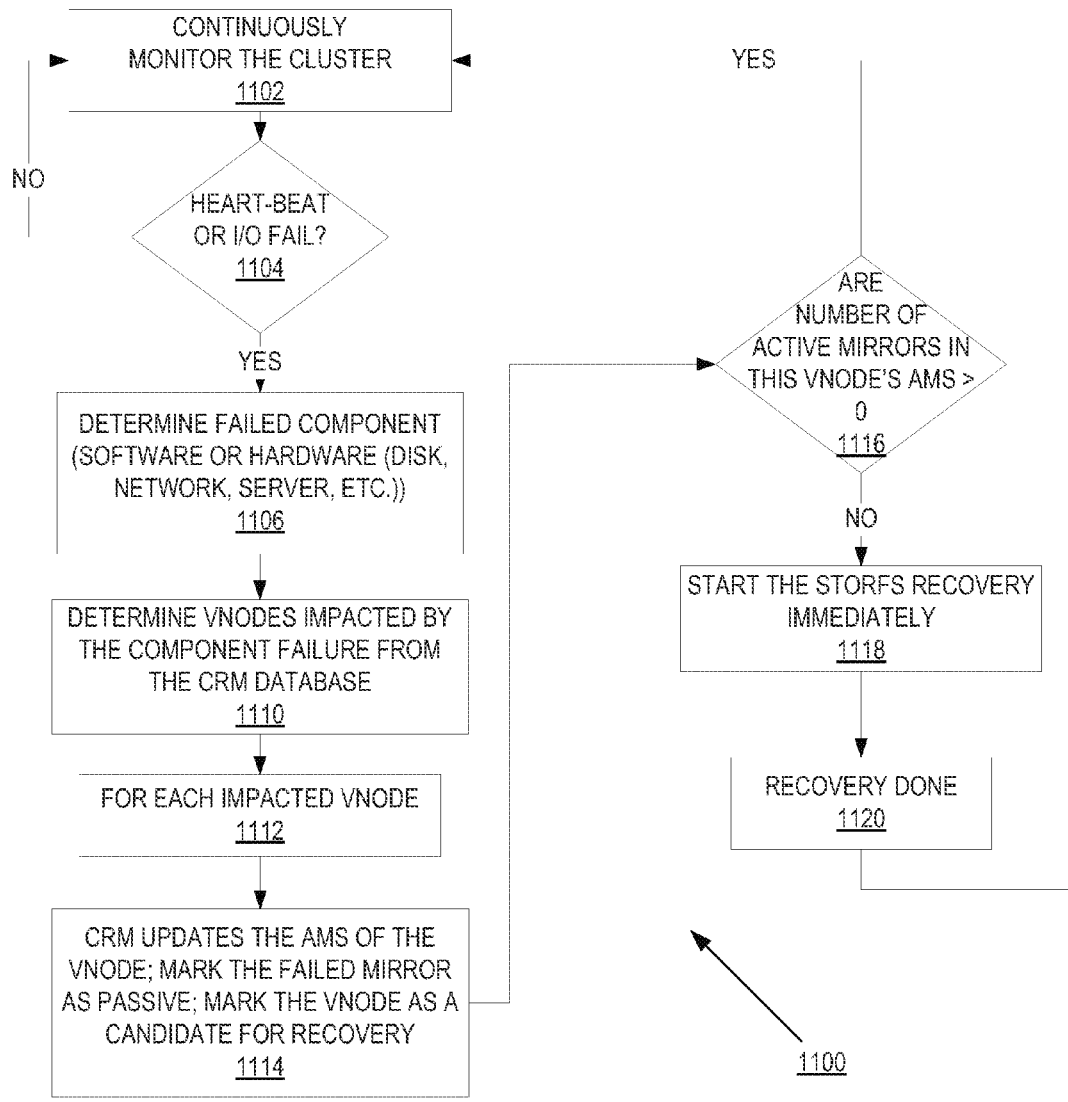
FIG. 11 is a flow diagram of one embodiment of a process to handle a failure of a component.

FIG. 11 is a flow diagram of one embodiment of a process 1100 to handle a failure of a component. In one embodiment, process 1100 is performed by the fault tolerance layer 204 of an SC server 200 as described in FIG. 2 above. In one embodiment, the failure recovery is performed by each SC server in the StorFS system, which allows for a distributed failure recovery. In this embodiment, the StorFS system is not dependent on a single node for failure recovery. In FIG. 11, process 1100 begins by monitoring the StorFS system at block 1102. In one embodiment, process 1100 monitors the storage cluster of the StorFS system for failures of any one of the components. A failure of the component in the StorFS system can be an entire node (e.g., a storage node) or a component of the node (e.g., disk, network, controller, etc.). At block 1104, process 1100 determines if a heartbeat of component failed or if an I/O operation failed. In one embodiment, process 1100 could detect a component failure by determining that a heartbeat of component is no longer reporting. For example and in one embodiment, heartbeats are small messages that are exchanged between the storage nodes. If a storage node fails to receive heartbeat message from its peer node, it indicate a potential failure of that peer node. In another embodiment, process 1100 detects an I/O failure if a component of the SC server 200 that is performing process 1100 detects an I/O failure, such as a failure to write an entry to a write log, performing a synchronous replication, performing an asynchronous replication, sending content to persistent storage, monitoring, garbage collection, deduplication, etc.

If there is no heartbeat or I/O failure is detected, execution proceeds to block 1102. If there is a heartbeat or an I/O failure, at block 1106, process 1100 determined the failed component related to the heartbeat or I/O failure detect at block 1104. In one embodiment, the failed component could be the SC server performing process 1100 or could be a remote SC server. In one embodiment, the failed component could be failed server of hardware component (e.g., disk, network, server, etc.).

Based on the failed component, process 1100 determines the vNodes impacted by the component failure at block 1110. In one embodiment, process 1100 uses the CRM table to determined which vNodes are impacted by the component failure. In this embodiment, process 1100 determines the whether the entire pNode has failed or a component within a pNode (e.g., disk, controller, network interface, etc.). If pNode fails, all the vNodes in that pNode are impacted. If a pNode component fails, one or some of the vNodes associated with that component are impacted. In one embodiment, the CRM table includes information mapping vNodes to the pNode as well as which vNode is dependent on which component of the pNode (e.g., which disk stores which vNode, etc.). There can be one or more vNodes impacted by the failed component. Process 1100 additionally performs a processing loop (blocks 1112-1118) to perform a distributed recovery of the vNodes that correspond to the failed component.

At block 1114, process 1100 updates the AMS of that vNode. In one embodiment, process 1100 marks that vNode as passive, which indicates that the vNode is not an active vNode of the AMS. In one embodiment, a passive vNode is a node that is not available to perform I/O operations. In one embodiment, a passive vNode attempts to catch up via the resync operation as described in FIG. 12 below. In this embodiment, once a passive vNode is resynced, the vNode becomes an active vNode. In addition, process 1100 marks the vNode as a candidate for recovery. In one embodiment, recovering a vNode consists of copying data from other active vNode in the passive vNode's AMS, so that the passive vNode can be brought up to date with the current content for that vNode. Process 1100 determines if the number of active mirror vNodes in the AMS for that passive vNode is greater than zero. If the number of active node in the AMS is greater than zero, execution proceeds to block 1102 above. In one embodiment, the passive vNode is marked for recovery and recovery of that vNode happens synchronously as described in FIG. 13 below. If the number of active nodes if is zero, at block 1118, process 1100 starts the StorFS recovery. In one embodiment, the StorFS recover is further described in FIG. 12 below. At block 1120, the process 1100 completes the recovery.

Figure 12:
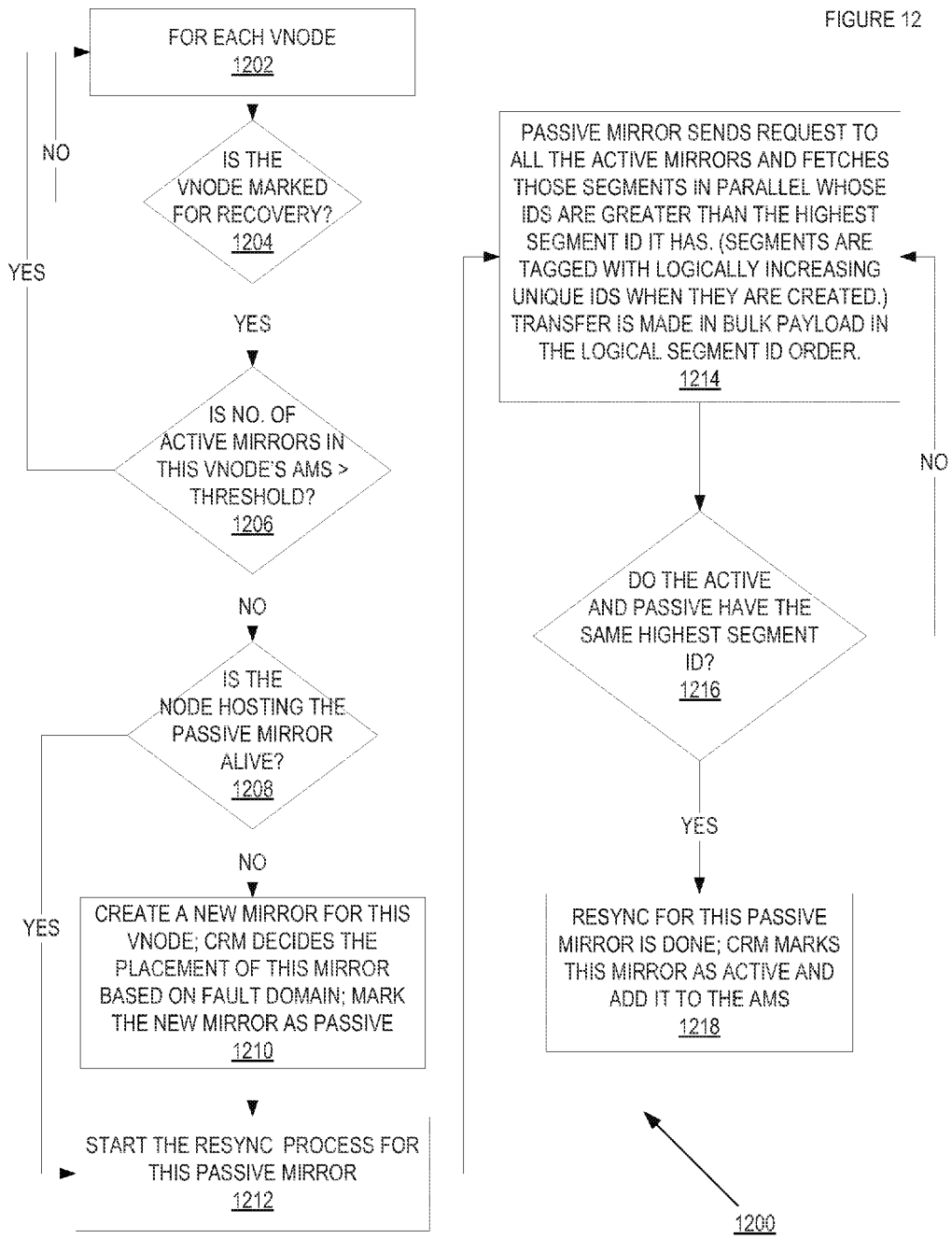
FIG. 12 is a flow diagram of one embodiment of a process to perform a distributed failure recovery.

FIG. 12 is a flow diagram of one embodiment of a process 1200 to perform a distributed failure recovery of one or more vNodes. In FIG. 12, process 1200 begins by performing processing loop (blocks 1202-1218) to perform a distributed recovery for each vNode. At block 1204, process 1200 determines if the vNode is marked for recovery. If the vNode is not marked for recovery, execution proceeds to block 1202 above. In one embodiment, a vNode marked for recovery is a vNode that was or is associated with a failed component and the content of that vNode may be out of sync with the content that is to be stored on that vNode. For example and in one embodiment, a SC server could fail and the vNode stored on that SC server would be marked for recovery. If the vNode is marked for recovery, execution proceeds to block 1206.

At block 1206, process 1200 determines if the number of active mirrors in the AMS for this vNode is greater than the threshold. In one embodiment, if the number of active mirror is large enough, then that vNode is not necessary for that vNode to be recovered. This means that there are enough active mirrors for the content that is stored in AMS vNode set. If the number of mirrors in the AMS for this vNode is greater than the threshold, execution proceeds to block 1202 above and this vNode is not recovered. If there are enough active vNodes, the passive vNode remains marked for recovery and recovery happens at a later time. If the number of mirrors in the AMS for this vNode is less than or equal to the threshold, process 1200 determines if the node hosting the vNode is alive. In one embodiment, process 1200 could send a heartbeat message to the node to determine if the node is alive. For example and in one embodiment, this node may have temporarily failed and restored itself and is now back up. If the node hosting vNode is alive, execution proceeds to block 1212, where process 1200 starts the resync process for this vNode.

If the node hosting the vNode is not alive, at block 1210, process 1200 creates a new passive mirror vNode for this vNode. In one embodiment, this new passive mirror vNode is used for recovery. In one embodiment, process 1200 requests from the CRM to create the passive mirror vNode. In this embodiment, the CRM determines a placement of the new mirror vNode based on the fault domain of the failed vNode. For example and in one embodiment, the CRM places that new mirror vNode in a fault domain that is different from the fault domain of the failed vNode and other vNodes in the AMS set of the failed vNode. Process 1200 further marks this new mirror vNode as passive. In this embodiment, the new passive vNode is the node used for the resync at block 1212 below. Execution proceeds to block 1212 below.

At block 1214, process 1200 performs a resync for the passive vNode. The passive vNode to be resynced could be the original vNode marked for recovery or a new passive mirror vNode created for the resync. In one embodiment, the resync operation occurs by the passive node hosting the passive mirror vNode sending requests to one, some, or all of the active mirrors in the AMS set for the passive vNode. In one embodiment, the passive mirror fetches the segments from other active mirrors whose ID is higher than its (passive mirror's) highest segment ID. In one embodiment, the data in the mirrors is stored by segment, which allows for efficient storage of the content for that vNode. In one embodiment, the passive vNode that is being resync may have some the content already stored (e.g., if a node that hosts the failed vNode fails and recovers, this failed vNode may have some or most of the content and is missing the most recent content). In this embodiment, the failed vNode will need the just the missing content. This missing content is identified by the segment ID. By comparing segment ID and not using "diff-and-copy" approach, the resync process is more efficient because comparison of segment IDs is a more efficient process that comparison of the actual stored content. In addition, the segment IDs are stored sequentially, which allows the resync process to determine which is the latest segment ID successfully stored on the passive vNode. Once that is determined, the resync process can copy segment ID greater the last successful segment ID to the passive vNode. In one embodiment, the resync process can copy content from different active mirror vNodes. By resyncing using segments, the resync process can use bulk transfers to copy content in logical segment ID order.

At block 1216, process 1200 checks if the active mirror vNodes and the passive vNode being resync have the same highest segment ID. If these vNodes do have the same highest segment ID, the resync process for this passive vNode is complete and execution proceeds to block 1218. At block 1218, process 1200 marks the passive vNode as active and adds the passive vNode into the AMS. Execution proceeds to block 1202 above, where another vNode is resynced. If these vNodes do not have the same highest segment ID, execution proceeds to block 1214 above.

In one embodiment, the StorFS system distributes a storage workload across the cluster by stripping it across multiple virtual nodes. Stripping achieves capacity and performance load balancing and provides higher cumulative performance rather than being bottlenecked by one cluster node. One of the characteristics as well as the challenges in a hybrid storage/compute cluster is the constant change in the StorFS systems' behavior. For example, an application's requirements may change; workloads or resources may be added or removed to/from the cluster; and/or there can be a failure in the StorFS system (e.g. a network failure, disk failure, server failure, etc.) that may change the cluster's resource availability. The StorFS system is designed to continuously adapt to these kinds of changes by automatically balancing load across available resources. These resources are of different kinds: CPU, network, memory, storage capacity, storage bandwidth, etc.

In one embodiment, the StorFS system performs a multi-dimensional optimization across this heterogeneous set of resources. This is facilitated by estimating the requirements of each virtual node, estimating resource availability in each cluster nodes and migrating one or more virtual nodes from one physical node to the other. For example and in one embodiment, if the network becomes a bottleneck in a physical node (pNode), one or more metadata vNodes in that pNode can be relocated to another pNode that has more network capacity available. Similarly, if a pNode runs out of disk capacity, a new data vNode can be created on other pNodes or a vNode can be relocated to another pNode with more disk capacity. In one embodiment, this migration is achieved by creating a new replica of the source vNode at the destination pNode. The vNode at the destination pNode is populated in parallel from the replicas of the source vNode. While the destination vNode is being updated, the source vNode may change due to new I/O from the client. This new I/O is be appended to the source vNode and assigned new logical sequence ID. The destination vNode will continuously sync from the source based on these sequence IDs. Once they are in sync, the vNode to pNode mapping in the Cluster Manager's routing table is updated so that I/Os are routed to the new location. This ensures that the storage service remains uninterrupted when a vNode is being moved. This load distribution happens on a continuous basis and ensures that resources are utilized optimally and each workload receives the resource it need.

In one embodiment, the StorFS system is capable of supporting different policies at different level of granularity: at the file system level, at the individual file level, etc. These policies specify the performance, reliability, and other quality of service requirements of the applications. The system translate these high level polices to low-level system configuration. For example, the StorFS system is able to automatically select the type of storage medium (SSD v. HDD) based on application performance requirement. Similarly, based on these policies, the StorFS system can decide whether to compress or de-duplicate the data, the level of mirroring, etc.

Data services like snapshot, cloning, backup, disaster recovery, etc., can be critical for any enterprise storage systems. A naïve way to implement such data services is to perform a full copy of the current storage. This is, however, very inefficient and takes lot of time and resources. More advanced storage systems implement these data services by keeping track of changes since the clones (or snapshots) were created instead of full copy. This consumes less storage resources. Single node data services are relatively easier to build, as the metadata is readily available in one central place. Building efficient data services in a distributed storage system poses significant challenges.

In one embodiment, the StorFS system uses techniques to efficiently track changes in a distributed setting. For example and in one embodiment, the StorFS is capable of performing low overhead data services at different level of granularity: from the file system level to the individual files level. As discussed above, the StorFS system stripes file and file system data across multiple storage nodes in our cluster. Snapshotting a file, for example, involves creating a small metadata entry in the storage vNodes containing that file. This snapshot process is extremely fast and require minimal amount of resources. There is no data copy involved. Furthermore, the StorFS permits creating large number of snapshots (or clones) without any deterioration in performance.

Figure 13:
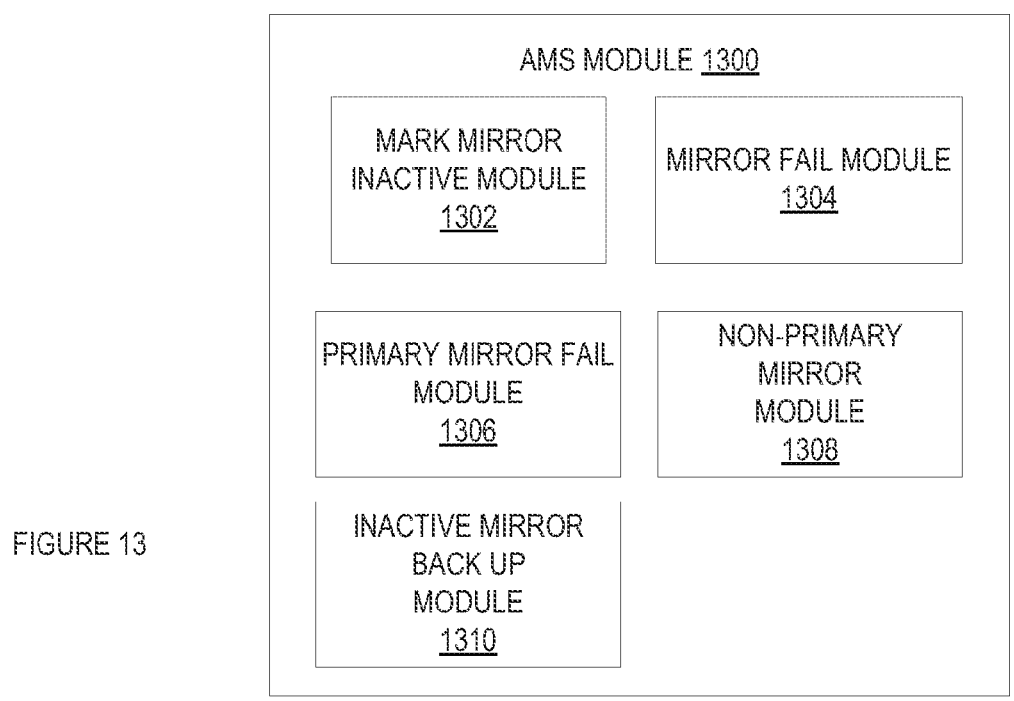
FIG. 13 is a block diagram of one embodiment of an AMS module to process for Active Mirror Set (AMS) management with strong consistency and high availability.

FIG. 13 is a block diagram of one embodiment of an AMS 1300 module to process for AMS management with strong consistency and high availability. In one embodiment, the AMS module 1300 is part of the cluster resource manager 202 that performs the AMS management process 400 as described in FIG. 4 above. In one embodiment, the AMS module 1300 includes a mark mirror inactive module 1302, mirror fail type module 1304, primary mirror fail module 1306, non-primary mirror module 1308, and inactive mirror up module 1310. In one embodiment, the mark mirror inactive module 1302 marks a mirror as inactive as described in FIG. 4, block 402 above. The mirror fail type module 1304 determines the type of mirror that failed as described in FIG. 4, block 404 above. The primary mirror fail module 1306 processes a primary mirror failure as described in FIG. 4, block 406 above. The non-primary mirror module 1308 processes a non-primary mirror failure as described in FIG. 4, block 408 above. The inactive mirror up module 1310 handles an inactive mirror coming back up as described in FIG. 4, block 410 above.

Figure 14:
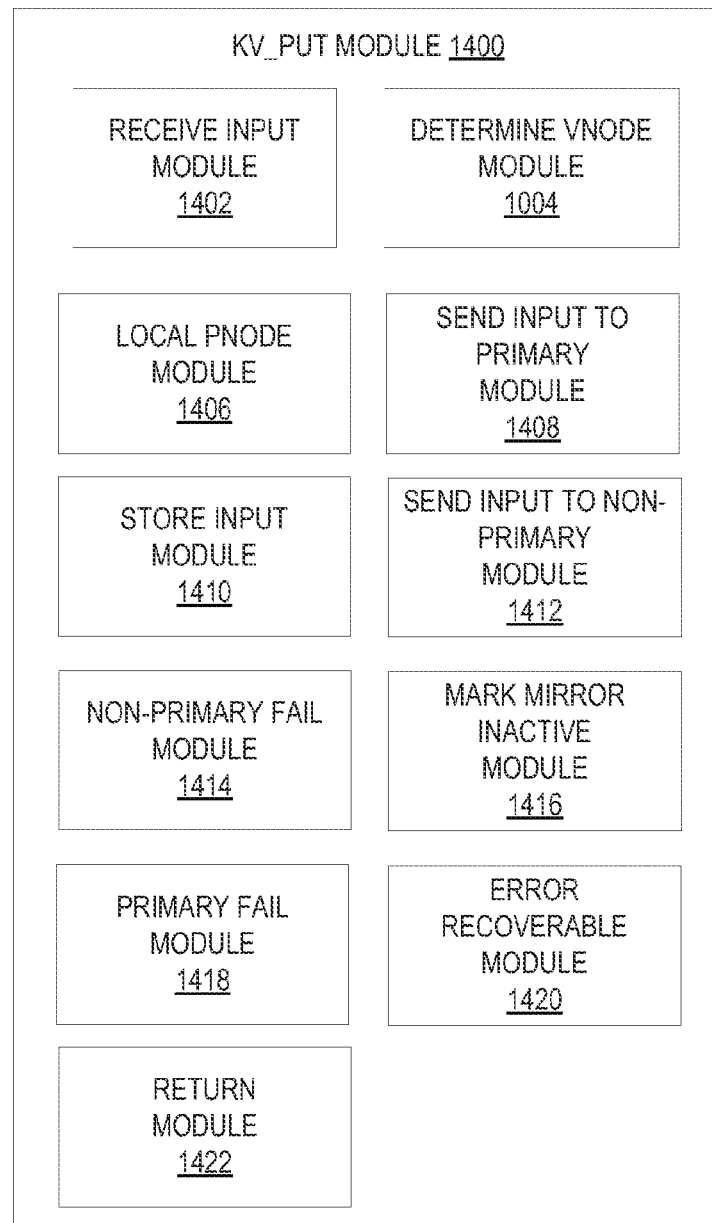
FIG. 14 is a block diagram of one embodiment of a KV_put module to process a KV_put operation.

FIG. 14 is a block diagram of one embodiment of a KV_put module 1400 to process a KV_put operation. In one embodiment, the KV_put module 1400 is part of the distributed object layer 218 that performs the KV_put process as described in FIG. 5 above. In one embodiment, the KV_put 1400 module includes a receive input module 1402, determine vNode module 1404, local pNode module 1406, send to primary module 1408, store input module 1410, send to non-primary module 1412, non-primary fail module 1414, mark mirror inactive module 1416, primary mirror fail module 1418, error recoverable module 1420, and return module 1422. In one embodiment, the receive input module 1402 receives the input for the KV_put operation as described above in FIG. 5, block 502 above. The determine vNode module 1404 determines the vNode for the KV_put operation as described above in FIG. 5, block 504 above. The local pNode module 1406 determines if the local pNode is a primary mirror as described above in FIG. 5, block 506 above. The send to primary module 1408 sends the input to the primary mirror as described above in FIG. 5, block 508 above. The store input module 1410 stores the object in the primary mirror's segment store as described above in FIG. 5, block 510 above. The send to non-primary module 1412 sends the input to the non-primary mirrors as described above in FIG. 5, block 512 above. The non-primary fail module 1414 determines if any of the non-primary mirrors have failed as described above in FIG. 5, block 514 above. The mark mirror inactive module 1416 marks the non-primary mirror as inactive as described above in FIG. 5, block 516 above. The primary mirror fail module 1418 determines if the primary mirror has failed as described above in FIG. 5, block 518 above. The error recoverable module 1420 determines if the error is recoverable as described above in FIG. 5, block 520 above. The return module 1422 returns the result as described above in FIG. 5, blocks 522 and 524 above.

Figure 15:
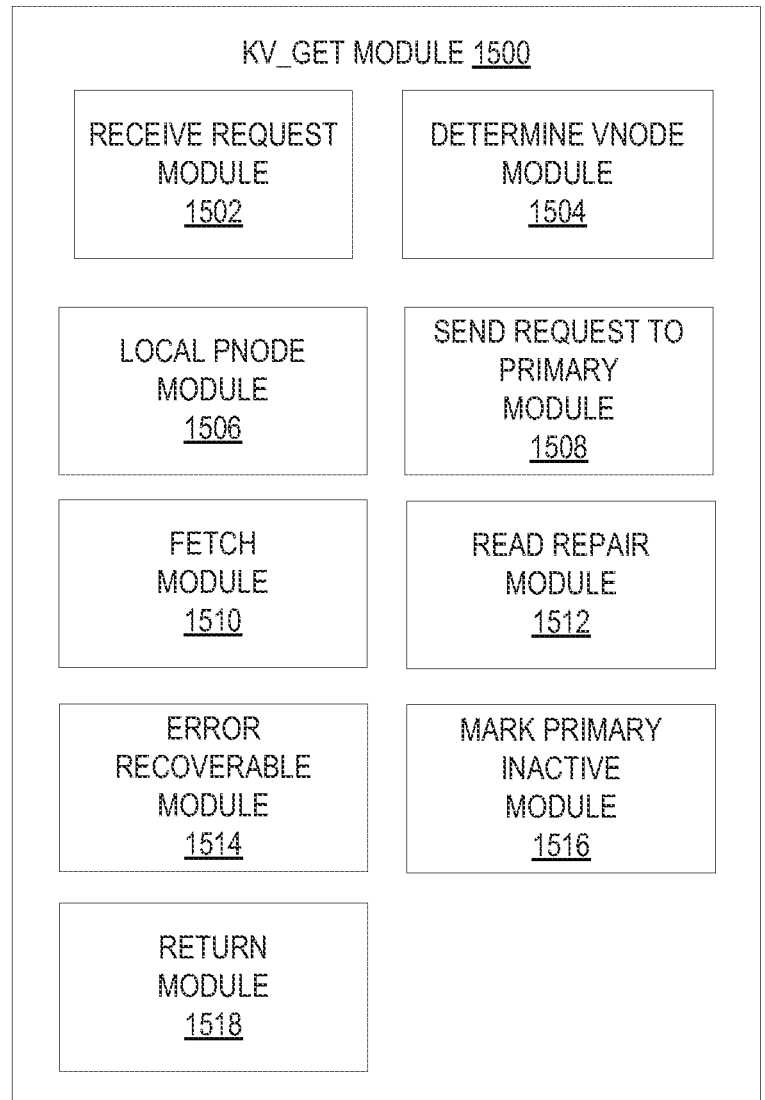
FIG. 15 is a block diagram of one embodiment of a KV_get module to process a KV_get operation.

FIG. 15 is a block diagram of one embodiment of a KV_get module 1500 to process a KV_get operation. In one embodiment, the KV_get module 1500 is part of the distributed object layer 218 that performs the KV_get process as described in FIG. 6 above. In one embodiment, the KV_get module 1500 includes a receive request module 1502, determine vNode module 1504, local pNode module 1506, send request to primary module 1508, fetch module 1510, read repair module 1512, non-primary fail module 1514, mark primary inactive module 1516, and return module 1518. In one embodiment, the receive request module 1502 receives the request for the KV_get operation as described above in FIG. 6, block 602 above. The determine vNode module 1504 determines the vNode for the KV_get operation as described above in FIG. 6, block 604 above. The local pNode module 1506 determines if the local pNode is a primary mirror as described above in FIG. 6, block 606 above. The send request to primary module 1508 sends the KV_get request to the primary mirror as described above in FIG. 6, block 608 above. The fetch module 1510 fetches the requested object as described above in FIG. 6, block 610 above. The read repair module 1512 performs a read repair as described above in FIG. 6, block 616 above. The error recoverable module 1514 determines if the error is recoverable as described above in FIG. 6, block 620 above. The mark primary inactive module 1516 marks the primary as inactive as described above in FIG. 6, block 624 above. The return module 1518 returns success or failure as described above in FIG. 6, blocks 614 and 622 above.

Figure 16:
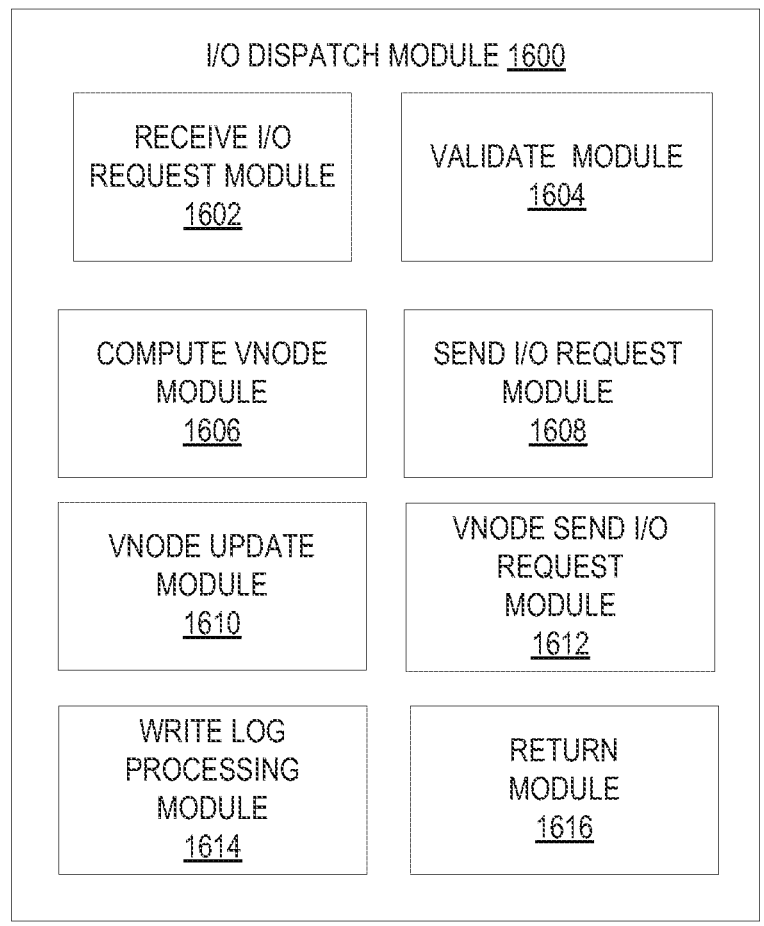
FIG. 16 is a block diagram of one embodiment of an input/output dispatch module to dispatch an input/output request.

FIG. 16 is a block diagram of one embodiment of an I/O dispatch module 1600 to dispatch an input/output request. In one embodiment, the I/O dispatch module 1600 part of the Storage Controller 104 that performs the I/O dispatch process as described in FIG. 8 above. In one embodiment, the I/O dispatch module 1600 includes a receive I/O request module 1602, validate module 1604, compute vNode module 1606, send I/O request module 1608, vNode update module 1610, vNode send I/O request module 1612, write log processing module 1614, and return module 1616. In one embodiment, the receive I/O request module 1602 receives the I/O request from a client as described in FIG. 8, block 802 above. The validate module 1604 validates the request as described in FIG. 8, block 804 above. The compute vNode module 1606 compute the target vNode as described in FIG. 8, block 806 above. The send I/O request module 1608 sends the I/O request as described in FIG. 8, block 808 above. The vNode update module 1610 determines the vNodes that need to be updated as described in FIG. 8, block 810 above. The vNode send I/O request module 1612 sends the I/O request to the vNodes as described in FIG. 8, block 812 above. The write log processing module 1614 processes the writing to the write logs as described in FIG. 8, blocks 816-822 above. The return module 1616 returns the results or an error code as described in FIG. 8, blocks 824 and 826 above.

Figure 17:
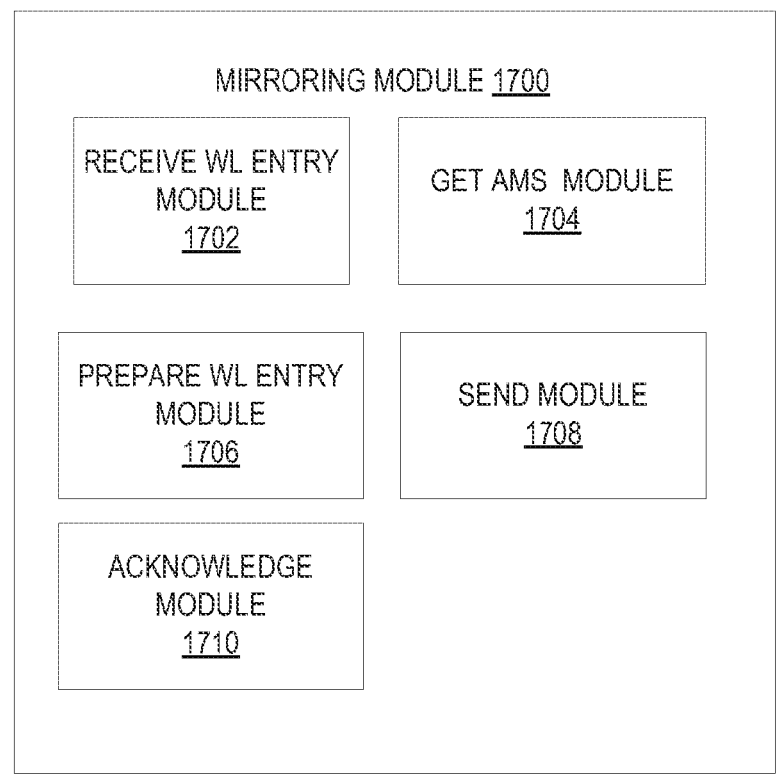
FIG. 17 is a block diagram of one embodiment of a mirroring module to perform synchronous mirroring.

FIG. 17 is a block diagram of one embodiment of a mirroring module 1700 to perform synchronous mirroring. In one embodiment, the distributed object layer include the mirroring module 1700. In one embodiment, the mirroring module 1700 includes a receive write log entry module 1702, get AMS module 1704, prepare write log entry module 1706, send module 1708, and acknowledge module 1710. In one embodiment, the receive write log entry module 1702 receives the write log entry as described above in FIG. 9, block 902. The get AMS module 1704 get the AMS for the write log entry as described above in FIG. 9, block 904. The prepare write log entry module 1706 prepares the write log entry as described above in FIG. 9, block 906. The send module 1708 send the write log entry to a mirror as described above in FIG. 9, block 908. The acknowledge module 1710 receives an acknowledgement as described above in FIG. 9, block 910.

Figure 18:
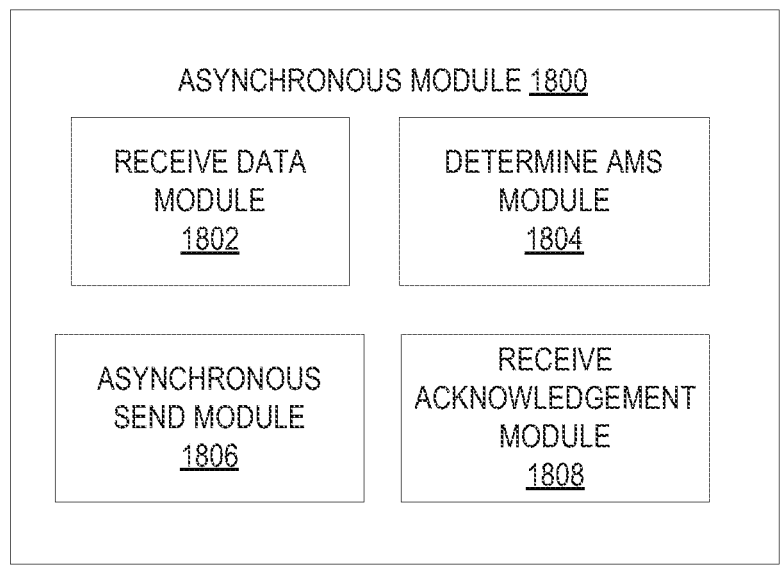
FIG. 18 is a block diagram of one embodiment of an asynchronous module to asynchronously mirror data and metadata.

FIG. 18 is a block diagram of one embodiment of an asynchronous module 1800 to asynchronously mirror data and metadata. In one embodiment, the asynchronous module 1800 includes a receive data module 1802, determine AMS module 1804, asynchronous send module 1806, and receive acknowledgement module 1808. In one embodiment, the receive data module 1802 receives the input as described above in FIG. 10, block 1002. The determine AMS module 1804 determines the AMS for the target node as described above in FIG. 10, block 1004. The asynchronous send module 1806 asynchronous sends the data and metadata to the vNode as described above in FIG. 10, block 1006. The receive acknowledgement module 1808 receives an acknowledgement as described above in FIG. 10, block 1008.

Figure 19:
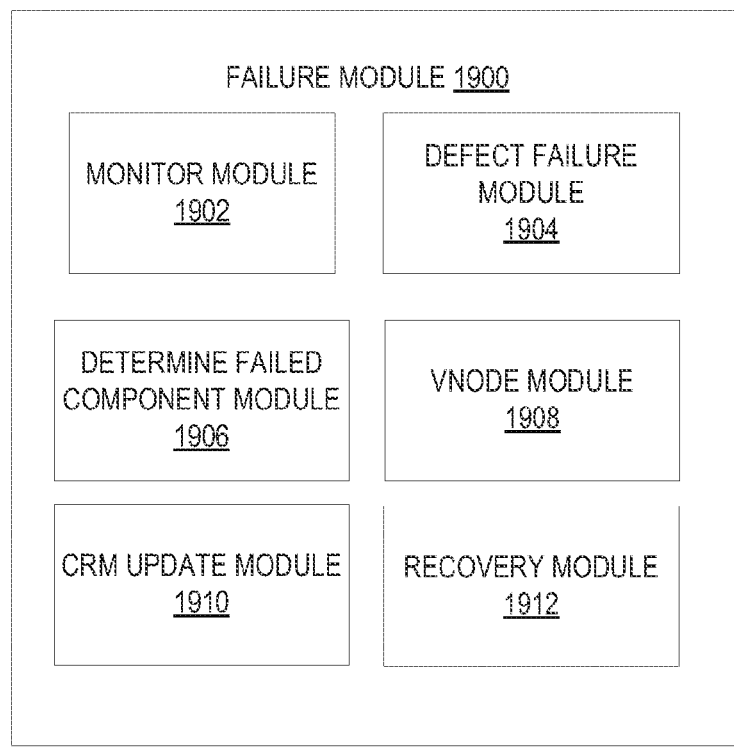
FIG. 19 is a block diagram of one embodiment of a failure module to handle a failure of a component.

FIG. 19 is a block diagram of one embodiment of a failure module 1900 to handle a failure of a component. In one embodiment, the fault tolerance layer 204 includes the failure module 1900. In one embodiment, the failure module 1900 includes a monitor module 1902, detect failure module 1904, determine failed component module 1906, vNode module 1908, CRM update module 1910, and recovery module 1911. In one embodiment, the monitor module 1902 monitors the cluster as described above in FIG. 11, block 1102. The detect failure module 1904 detects a failure as described above in FIG. 11, block 1104. The determine failed component module 1906 determines the failed component as described above in FIG. 11, block 1106. The vNode module 1908 determines the impacted vNodes as described above in FIG. 11, block 1110. The CRM update module 1910 performs CRM updates as described above in FIG. 11, block 1114. The recovery module 1912 starts the StorFS recovery as described above in FIG. 11, block 1118.

Figure 20:
FIG. 20 is a block diagram of one embodiment of a recovery module to perform a distributed failure recovery.

FIG. 20 is a block diagram of one embodiment of a recovery module 2000 to perform a distributed failure recovery. In one embodiment, the recovery module 2000 includes a marked module 2002, active mirror check module 2004, alive mirror module 2006, create mirror module 2008, resync module 2010, and mirror send module 2012. In one embodiment, the marked module 2002 determines if the vNode is marked for recovery as described above in FIG. 12, block 1204. The active mirror check module 2004 checks if the number of active mirrors is greater that a threshold as described above in FIG. 12, block 1206. The alive mirror module 2006 determines if the node hosting the passive mirror is alive as described above in FIG. 12, block 1208. The create mirror module 2008 creates a new mirror as described above in FIG. 12, block 1210. The resync module 2010 starts the resync process as described above in FIG. 12, block 1212. The mirror send module 2012 sends requests to the active mirrors as described above in FIG. 12, block 1214.

Figure 21:
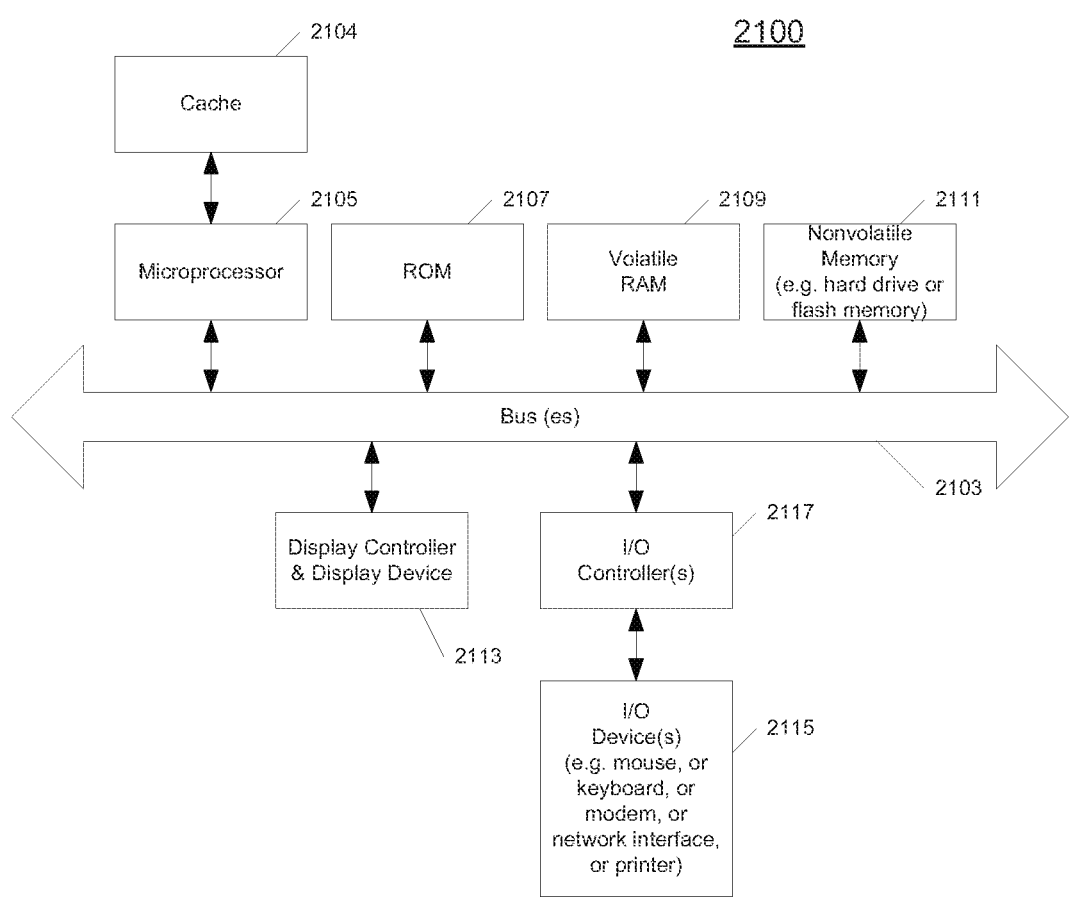
FIG. 21 illustrates one example of a typical computer system, which may be used in conjunction with the embodiments described herein.

FIG. 21 shows one example of a data processing system 2100, which may be used with one embodiment of the present invention. For example, the system 2100 may be implemented including a physical server 102A-C as shown in FIG. 1. Note that while FIG. 21 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 21, the computer system 2100, which is a form of a data processing system, includes a bus 2103 which is coupled to a microprocessor(s) 2105 and a ROM (Read Only Memory) 2107 and volatile RAM 2109 and a non-volatile memory 2111. The microprocessor 2105 may retrieve the instructions from the memories 2107, 2109, 2111 and execute the instructions to perform operations described above. The bus 2103 interconnects these various components together and also interconnects these components 2105, 2107, 2109, and 2111 to a display controller and display device 2113 and to peripheral devices such as input/output (I/O) devices which may be mice, keyboards, modems, network interfaces, printers and other devices which are well known in the art. Typically, the input/output devices 2115 are coupled to the system through input/output controllers 2117. The volatile RAM (Random Access Memory) 2109 is typically implemented as dynamic RAM (DRAM), which requires power continually in order to refresh or maintain the data in the memory.

The mass storage 2111 is typically a magnetic hard drive or a magnetic optical drive or an optical drive or a DVD RAM or a flash memory or other types of memory systems, which maintain data (e.g. large amounts of data) even after power is removed from the system. Typically, the mass storage 2111 will also be a random access memory although this is not required. While FIG. 21 shows that the mass storage 2111 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 2103 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "process virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "transmitting," "computing," "sending," "forwarding," "dispatching," "detecting," "performing," "scheduling," "communicating," "reading," "writing," "transferring," "updating," "returning," "merging," "appending," "fetching," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A non-transitory machine-readable medium having executable instructions to cause one or more processing units to perform a method to dispatch an input/output request in a distributed storage system, the method comprising:

receiving, at a storage controller client, the input/output request, wherein the distributed storage system includes the storage controller client, a plurality of storage controller servers, a plurality of virtual nodes distributed among a plurality of physical nodes, and each of the plurality of physical nodes is hosted on one of the plurality of storage controller servers;

computing a target virtual node for the input/output request, wherein the target virtual node is one of the plurality of virtual nodes and the target virtual node is computed using a deterministic placement function without storing a global map;

determining a target physical node that corresponds to the target virtual node, wherein the target physical node is one of the plurality of physical nodes; and dispatching the input/output request to a target storage controller server that corresponds to the target physical node, wherein the target storage controller server is one of the plurality of storage controller servers.

2. The non-transitory machine-readable medium of claim 1, wherein the input/output request is selected from the group consisting of a write operation request, a read operation request, and a query operation request.

3. The non-transitory machine-readable medium of claim 1, wherein the storage controller client and the target storage controller are on different devices that are coupled together by a network.

4. The non-transitory machine-readable medium of claim 1, wherein the determining a target physical node comprises:

performing a lookup with the target virtual node for the target physical node using a storage routing table.

5. The non-transitory machine-readable medium of claim 1, wherein the dispatching comprises:

scheduling a dispatch of the input/output request to the target using a policy based on a characteristic of the input/output request; and transmitting the input/output request to the target storage controller server based on the scheduling.

6. A non-transitory machine-readable medium having executable instructions to cause one or more processing units to perform a method to write data in a distributed storage system, the method comprising:

receiving, at one of a plurality of storage controller servers, a write operation request to store data at a virtual node, wherein the write operation request is dispatched from a storage controller client to the one of the plurality of storage controller servers using a deterministic placement function without storing a global map, and the distributed storage system includes the storage controller client, and the plurality of storage controller servers; and in response to receiving the write operation request, writing the data to a mirror set of the virtual node.

7. The non-transitory machine-readable medium of claim 6, wherein a mirror set includes one or more mirrors that is used to replicate data and metadata of the virtual node.

8. The non-transitory machine-readable medium of claim 7, wherein the writing the data comprises:

determining a primary mirror of the mirror set; and
storing the data from a segment store of the primary mirror.

9. The non-transitory machine-readable medium of claim 8, wherein if the writing of the data is not successful,
marking the primary mirror as inactive; and
electing a new primary mirror.

10. The non-transitory machine-readable medium of claim 8, wherein the segment store is thin provisioned logical partition of distributed storage system.

11. The non-transitory machine-readable medium of claim 8, wherein the writing of the data further comprises:
storing the data in an active mirror of the mirror set.

12. The non-transitory machine-readable medium of claim 11, wherein if the storing of the data in the active mirror is not successful,
marking the active mirror as inactive.

13. The non-transitory machine-readable medium of claim 6, wherein the data includes an object to be stored and a key to reference the object.

14. A non-transitory machine-readable medium having executable instructions to cause one or more processing units to perform a method to process a read operation request in a distributed storage system, the method comprising:
receiving, at one of a plurality of storage controller servers, the read operation request for a virtual node, wherein the write operation request is dispatched from a storage controller client to the storage controller server using a deterministic placement function without storing a global map, and the distributed storage system includes the storage controller client and the plurality of storage controller servers; and
in response to receiving the read operation request,
determining a mirror set for the read operation request, and
reading data indicated in the read operation request from the mirror set.

15. The non-transitory machine-readable medium of claim 14, wherein a mirror set includes one or more mirrors that is used to replicate data and metadata of the virtual node.

16. The non-transitory machine-readable medium of claim 15, wherein the reading the data comprises:
determining a primary mirror of the mirror set; and
fetching the data from a segment store of the primary mirror.

17. The non-transitory machine-readable medium of claim 16, wherein if the fetching of the data is not successful, fetching the data from an active mirror of the mirror set.

18. The non-transitory machine-readable medium of claim 16, wherein if the fetching of the data is not successful, repairing the primary mirror.

19. The non-transitory machine-readable medium of claim 16, wherein if the fetching of the data is not successful,
marking the primary mirror as inactive; and
electing a new primary mirror from an active mirror of the mirror set.

20. A method to dispatch an input/output request in a distributed storage system, the method comprising:
receiving, at a storage controller client, the input/output request, wherein the distributed storage system includes the storage controller client, a plurality of storage controller servers, a plurality of virtual nodes distributed among a plurality of physical nodes, and each of the plurality of physical nodes is hosted on one of the plurality of storage controller servers;
computing a target virtual node for the input/output request, wherein the target virtual node is one of the plurality of virtual nodes and the target virtual node is computed using a deterministic placement function without storing a global map;
determining a target physical node that corresponds to the target virtual node, wherein the target physical node is one of the plurality of physical nodes; and
dispatching the input/output request to a target storage controller server that corresponds to the target physical node, wherein the target storage controller server is one of the plurality of storage controller servers.

21. A method to write data in a distributed storage system, the method comprising:
receiving, at one of a plurality of storage controller servers, a write operation request to store data at a virtual node, wherein the write operation request is dispatched from a storage controller client to the one of the plurality of storage controller servers using a deterministic placement function without storing a global map, and the distributed storage system includes the storage controller client, and the plurality of storage controller servers; and
in response to receiving the write operation request, writing the data to a mirror set of the virtual node.

22. A method to process a read operation request in a distributed storage system, the method comprising:
receiving, at one of a plurality of storage controller servers, the read operation request for a virtual node, wherein the write operation request is dispatched from a storage controller client to the storage controller server using a deterministic placement function without storing a global map, and the distributed storage system includes the storage controller client and the plurality of storage controller servers; and
in response to receiving the read operation request,
determining a mirror set for the read operation request, and
reading data indicated in the read operation request from the mirror set.

* * * * *